(12) United States Patent
Fukudome et al.

(10) Patent No.: US 12,082,502 B2
(45) Date of Patent: Sep. 3, 2024

(54) THERMOELECTRIC POWER GENERATION SYSTEM

(71) Applicant: Yanmar Holdings Co., Ltd., Osaka (JP)

(72) Inventors: Jiro Fukudome, Osaka (JP); Hirofumi Ukai, Osaka (JP); Shuji Tamaki, Osaka (JP); Yoshika Hatasako, Osaka (JP)

(73) Assignee: YANMAR HOLDINGS CO., LTD., Osaka (JP)

( * ) Notice: Subject to any disclaimer, the term of this patent is extended or adjusted under 35 U.S.C. 154(b) by 0 days.

(21) Appl. No.: 17/726,287

(22) Filed: Apr. 21, 2022

(65) Prior Publication Data
US 2022/0344559 A1 Oct. 27, 2022

(30) Foreign Application Priority Data
Apr. 22, 2021 (JP) .................. 2021-072759

(51) Int. Cl.
*H10N 10/13* (2023.01)
*H10N 10/80* (2023.01)

(52) U.S. Cl.
CPC ............. *H10N 10/13* (2023.02); *H10N 10/80* (2023.02)

(58) Field of Classification Search
CPC ................. H01L 35/02; H01L 35/30
See application file for complete search history.

(56) References Cited

U.S. PATENT DOCUMENTS

| | | | | | |
|---|---|---|---|---|---|
| 4,354,483 | A | * | 10/1982 | Johnston ................. | F24S 50/00 126/599 |
| 6,429,539 | B1 | * | 8/2002 | Suzuki .................. | H02J 7/1476 290/22 |
| 6,912,895 | B1 | * | 7/2005 | Jaeger ................... | G01M 15/09 73/861.52 |
| 2015/0068575 | A1 | * | 3/2015 | Komitsu ................ | F01N 5/025 136/212 |

FOREIGN PATENT DOCUMENTS

JP 6685880 B2 4/2020

* cited by examiner

*Primary Examiner* — Tamir Ayad
(74) *Attorney, Agent, or Firm* — NORTON ROSE FULBRIGHT US LLP

(57) ABSTRACT

With a thermo-siphon type heat exchanger including a heating section of and a heat transfer pipe of a thermoelectric power generation unit, the thermoelectric power generator recovers a heat from a hot gas flowing through a flow path and generates electricity. To the thermo-siphon type heat exchanger, a storage tank that stores a heat medium is connected in a communication state; transferring of the heat medium from the thermo-siphon type heat exchanger to the storage tank, and returning of the heat medium from the storage tank to the thermo-siphon type heat exchanger can adjust the heat medium amount in the thermo-siphon type heat exchanger. At least a part of the storage tank is placed in the flow path so that the stored heat medium is heated, and the stored heat medium can be cooled with a cooler that is capable of turning a cooling function ON/OFF.

20 Claims, 18 Drawing Sheets

THERMOELECTRIC POWER GENERATION SYSTEM

CROSS-REFERENCE TO RELATED APPLICATIONS

This application is claims priority under 35 U.S.C. § 119 to JP Application No. 2021-072759 filed Apr. 22, 2021, the entire contents of which are hereby incorporated by reference.

TECHNICAL FIELD

The present invention relates to a thermoelectric power generation system in which a thermoelectric power generator is placed to a flow path through which a hot gas flows, and a recovery heat from the hot gas is given to the thermoelectric power generator thereby to generate electricity.

BACKGROUND ART

Conventionally, there is known a thermoelectric power generator in which a heating section provided with a heat medium flow path on one side of a thermoelectric element and a cooling section provided with a cold medium flow path on the other side of the thermoelectric element and which generates electricity by a temperature difference between the heating section and the cooling section on respective sides of the thermoelectric element. Further, Patent Document 1 discloses that a part of the heat medium flow path in the thermoelectric power generator is placed in a duct or the like through which the hot gas flows, and the thermoelectric power generator is used as the thermoelectric power generation system that generates the electricity using the recovery heat from the hot gas.

PRIOR ART DOCUMENT

Patent Document

Patent Document 1: Japanese Patent No. 6685880

SUMMARY OF INVENTION

Technical Problem

The thermoelectric power generator in Patent Document 1 has improved a power generation amount by adjusting the pressure or temperature of a heat medium flowing through the heat medium flow path. However, even the thermoelectric power generator of Patent Document 1 has room for further improvement in view of simplifying and downsizing of a configuration of the thermoelectric power generator.

The present invention has been made in view of the above issues; it is therefore an object of the present invention to provide a thermoelectric power generation system that can downsize a thermoelectric power generator while improving the power generation amount in the thermoelectric power generator.

Solution to Problem

In order to solve the above problem, a thermoelectric power generation system of the present invention performs a power generation by giving a recovery heat from a heating flow path to a thermoelectric power generator, the thermoelectric power generator including; a heat exchanger that gives the recovery heat to a thermoelectric element; and a storage tank that stores a heat medium in the heat exchanger, wherein at least a part of the storage tank is placed in the heating flow path.

According to the above configuration, the power generation in the thermoelectric power generator can be improved by transferring/returning the heat medium between the storage tank and the heat exchanger while ordinarily heating the heat medium in the storage tank. Further, placing at least a part of the storage tank in the heating flow path eliminates the need for providing any other heating unit (such as a heater or a heating heat exchangers) for the storage tank, making it possible to simplify and downsize the configuration of the thermoelectric power generator.

Further, in the thermoelectric power generation system, the storage tank, outside the heating flow path, has a heat pipe connected to the storage tank, and the heat pipe is provided with a cooling section that cools the heat medium in the heat pipe.

According to the above configuration, controlling the cooling function by the cooling section ON/OFF adjusts the heat medium pressure in the storage tank, making it possible to control the transferring/returning of the heat medium between the storage tank and the heat exchanger. Further, the cooling section providing the cooling to the heat pipe of the storage tank from the outside can stabilize the cooling function.

Further, in the thermoelectric power generation system, the heat pipe is connected at both ends thereof to the storage tank, forming a loop circuit in a height direction.

According to the above configuration, the heat pipe forming the loop circuit in the height direction circulates the to-be-cooled heat medium in the heat pipe by a thermo-siphon effect, making it possible to improve a cooling efficiency at the time when the cooling function is turned on.

Further, in the thermoelectric power generation system, the cooling section has a cooling water flow path pipe that circulates cooling water used for cooling the heat medium, and a pressure sensor that detects a pressure in the storage tank, and flowrate of the cooling water flowing in the cooling water flow path pipe is adjustable based on a detection signal of the pressure sensor.

According to the above configuration, the cooling section adjusting the flowrate of the cooling water can perform, with higher accuracy, the pressure control of the heat medium in the thermoelectric power generator.

Further, in the thermoelectric power generation system, the heat pipe is provided with a control valve that is capable of controlling opening and closing or is capable of controlling an opening degree, and the heat medium's movement between the heat pipe and the storage tank is controllable by the control valve.

According to the above configuration, controlling the movement of the heat medium between the heat pipe and the storage tank can control the cooling function in the cooling section.

Further, in the thermoelectric power generation system, the storage tank is connected to a plurality of the heat exchangers, and the heat medium's circulation paths in the plurality of the heat exchangers are connected by a communicating pipe.

According to the above configuration, connecting the circulation paths of the heat medium in the plurality of heat exchangers an equalize the pressure in the plurality of heat exchangers. This makes it possible to control the total volume of the heat medium with one storage tank for a plurality of heat exchangers, making it possible to simplify the configuration of the thermoelectric power generator.

Further, in the thermoelectric power generation system, the plurality of the heat exchangers is placed in the heating flow path, and transferring of the heat medium from the heat exchanger to the storage tank is performed in the heat exchanger with a lowest heat source temperature, and returning of the heat medium from the storage tank to the heat exchanger is performed in the heat exchanger with a highest heat source temperature.

According to the above configuration, when a plurality of heat exchangers are placed with different heat source temperatures in the heating flow path, the heat exchanger with the low heat source temperature tends to have a large total amount of the heat medium, whereas the heat exchanger with the high heat source temperature tends to have a small total amount of the heat medium. In this regard, transferring, in the heat exchanger with the lowest heat source temperature, the heat medium from the heat exchanger to the storage tank, and returning, in the heat exchanger with the highest heat source temperature, the heat medium from the storage tank to the heat exchanger can eliminate an uneven distribution of the heat medium.

Further, in the thermoelectric power generation system, the plurality of the heat exchangers, in a height direction, is placed at different positions in the heating flow path, and transferring of the heat medium from the heat exchanger to the storage tank is performed in the heat exchanger with a lowest placing position, and returning of the heat medium from the storage tank to the heat exchanger is performed in the heat exchanger with a highest placing position.

According to the above configuration, when a plurality of heat exchangers are placed at different heights in the heating flow path, the heat exchanger at the low placing position tends to have a large total amount of the heat medium, whereas the heat exchanger at the high placing position tends to have a small total amount of the heat medium. In this regard, transferring, at the heat exchanger in the lowest placing position, the heat medium from the heat exchanger to the storage tank and returning, at the heat exchanger in the highest placing position, the heat medium from the storage tank to the heat exchanger can eliminate an uneven distribution of the heat medium.

Further, in the thermoelectric power generation system, the heat exchanger is placed in the heating flow path, and has a heat transfer pipe group that heats the heat medium by a heat of a heat source flowing in the heating flow path, and the storage tank is placed in a gap section in the heat transfer pipe group.

According to the above configuration, placing the storage tank in a manner to be inserted into the gap in the heat transfer pipe group eliminates the need for a space for placing the storage tank, making it possible to save the space of the thermoelectric power generation system in the thermoelectric power generator.

Further, in the thermoelectric power generation system, the storage tank is placed at a position where the heat source temperature is lower, in the heating flow path, than in the heat exchanger.

According to the above configuration, placing the storage tank on the downstream side of the heat exchanger eliminates an influence on the heat exchanger's heat recovering capability in the heating flow path.

Further, the thermoelectric power generation system, includes: a controller that is capable of switching the transferring of the heat medium from the heat exchanger to the storage tank and the returning of the heat medium from the storage tank to the heat exchanger, by a timer operation in a predetermined cycle.

According to the above configuration, it is possible to promote the heat medium's movement from the heat exchanger where the total amount of the heat medium is likely to be high to the heat exchanger where the total amount of the heat medium is likely to be low, making it possible to effectively eliminate an uneven distribution of the heat medium among a plurality of heat exchangers.

Further, the thermoelectric power generation system, includes: a controller that is capable of switching the transferring of the heat medium from the heat exchanger to the storage tank and the returning of the heat medium from the storage tank to the heat exchanger, based on a heat medium temperature of the heat exchanger, among the plurality of the heat exchangers, where the heat medium tends to be most insufficient.

According to the above configuration, it is possible to promote the heat medium's movement from the heat exchanger where the total amount of the heat medium tends to be large to the heat exchanger where the total amount of the heat medium tends to be small (where the heat medium tends to be most insufficient), making it possible to effectively eliminate an uneven distribution of the heat medium among a plurality of heat exchangers.

Advantageous Effects of Invention

A thermoelectric power generation system of the present invention, which adjusts a heat medium pressure in a storage tank and in a heat exchanger thereby to have improved a power generation amount in a thermoelectric power generator, eliminates the need for providing any other heating unit for the storage tank, exerting an effect of accomplishing the simplifying and downsizing of the configuration of the thermoelectric power generator.

DESCRIPTION OF EMBODIMENTS

Figure 1:
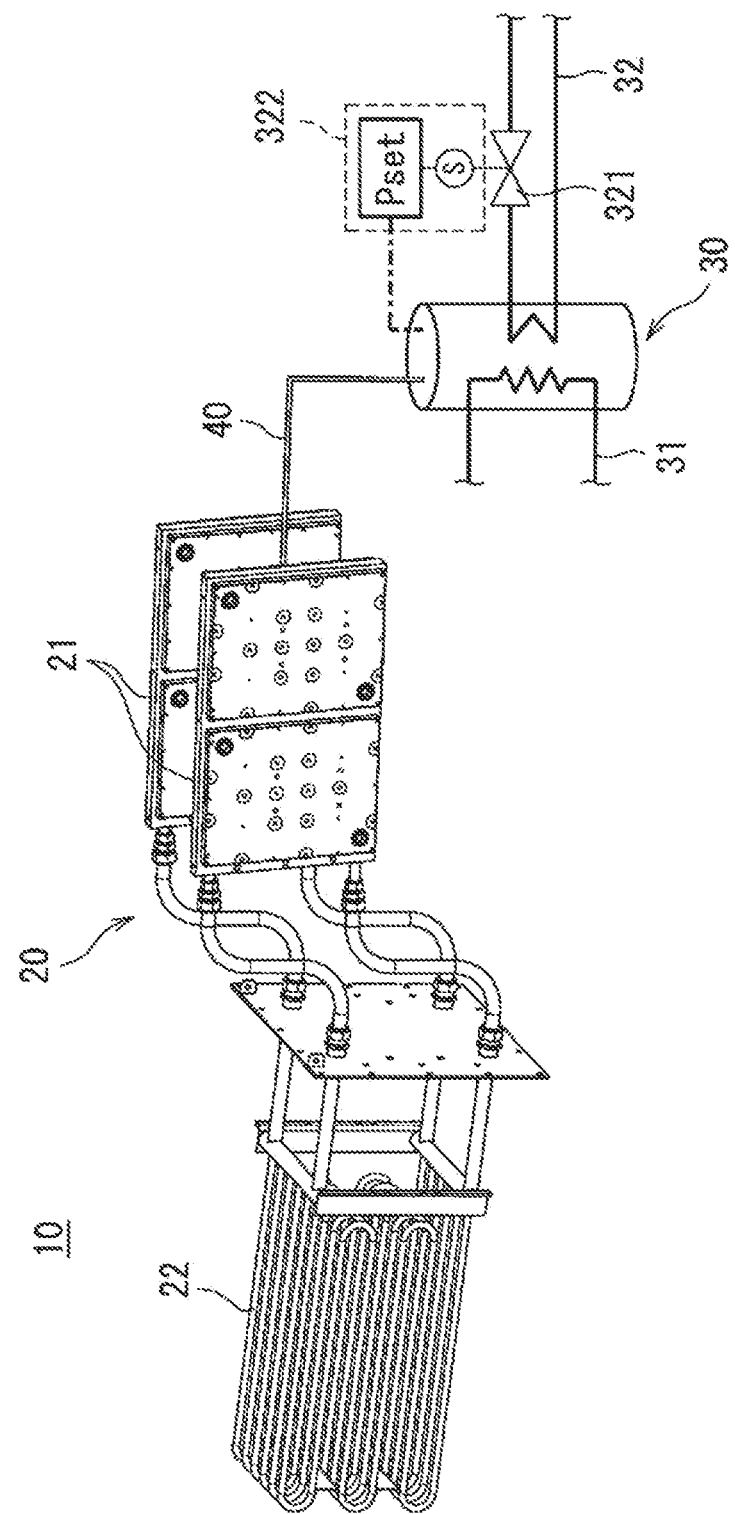
FIG. 1 schematically shows a configurational example of a thermoelectric power generator applicable to a thermoelectric power generation system of the present invention.

The following is a detailed description of the present invention with reference to the drawings. FIG. 1 schematically shows a configurational example of a thermoelectric power generator 10 applicable to a thermoelectric power generation system of the present invention. As shown in FIG. 1, the thermoelectric power generator 10 includes a configuration of connecting a thermoelectric power generation unit 20 with a storage tank 30.

(Thermoelectric Power Generation Unit 20)

Figure 2:
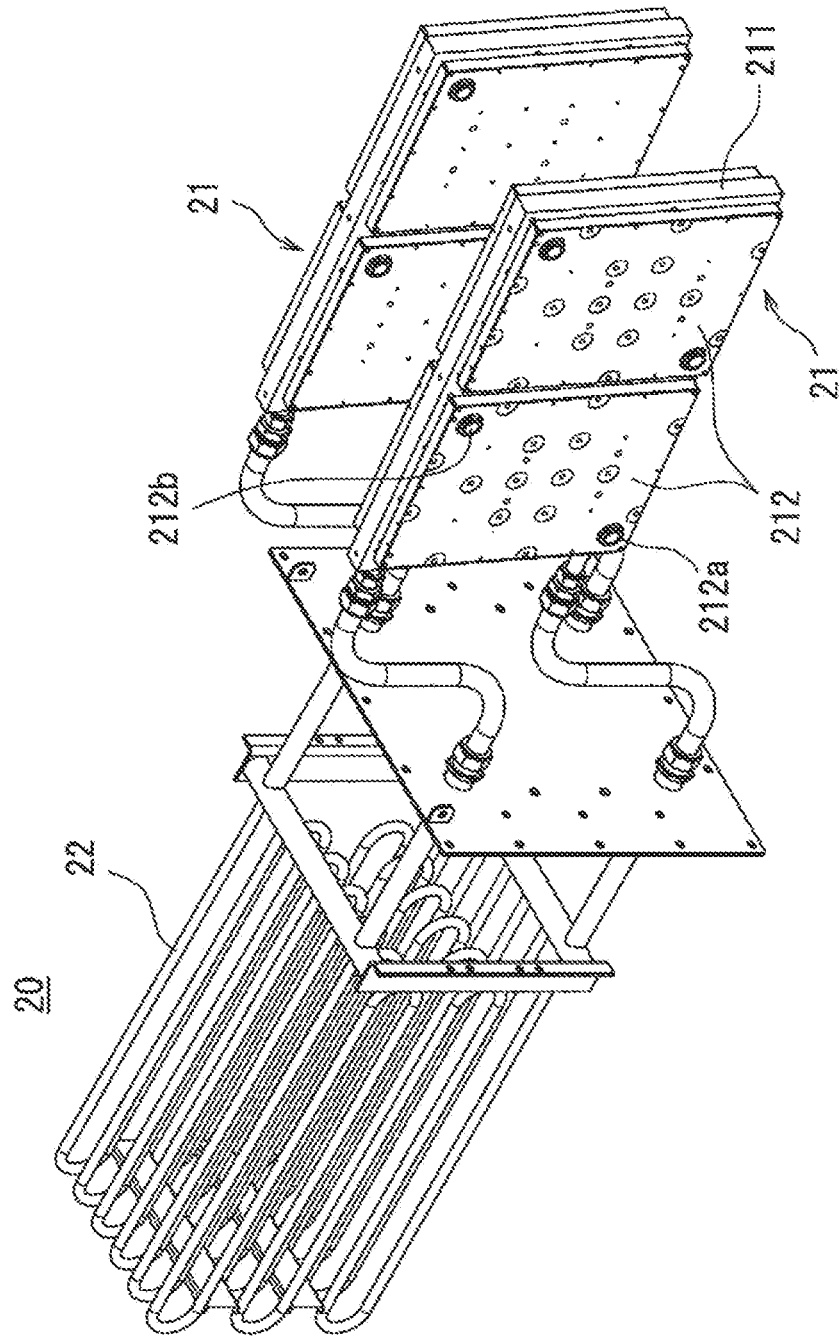
FIG. 2 is a perspective view showing a thermoelectric power generation unit extracted from the thermoelectric power generator.
Figure 3:
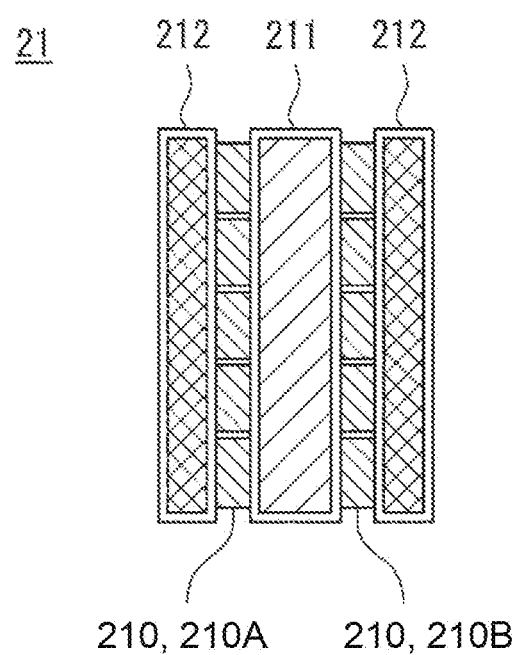
FIG. 3 is a longitudinal cross-sectional view of a power generation section in the thermoelectric power generation unit.

FIG. 2 is a perspective view showing the thermoelectric power generation unit 20 extracted from the thermoelectric power generator 10. As shown in FIG. 2, the thermoelectric power generation unit 20 roughly includes a power generation section 21 and a heat transfer pipe 22. FIG. 3 is a longitudinal cross-sectional view of the power generation section 21 in the thermoelectric power generation unit 20.

The power generation section 21 includes a thermoelectric element 210 with a heating section 211 provided on one side and a cooling section 212 provided on the other side. In the power generation section 21 of the present example, as shown in FIG. 3, thermoelectric elements 210 are provided on both sides of the heating section 211, and the cooling sections 212 are provided on both sides of the heating section 211 via the respective thermoelectric elements 210 in such a manner as to face each other.

The thermoelectric element 210 is an element having two sides, that is, one side (high temperature side) where the heating section 211 is provided, and the other side (low temperature side) where the cooling section 212 is provided. The thermoelectric element 210 is heated on one side by the heating section 211 and cooled on the other side by the cooling section 212, and generates electricity by using a temperature difference therebetween. The thickness of the thermoelectric element 210 is designed to be smaller than the size (width) of one side of and the other side of the thermoelectric element 210. Specifically, the thermoelectric element 210 is formed in the shape of a plate. In the example of FIG. 3, thermoelectric modules 210A and 210B, in which a plurality of thermoelectric elements 210 are connected in series, are attached to respective sides of the heating section 211. Specifically, the thermoelectric modules 210A, 210B having twenty thermoelectric elements 210 in four rows× five lines are attached to respective sides of the heating section 211. The number of thermoelectric elements 210 is not limited to this. For example, the power generation section 21 may be configured to attach one thermoelectric element 210 to each of both sides of the heating section 211.

The heating section 211 is formed by a metal material with excellent thermal conductivity. The heating section 211 is formed as a plate that contacts one side of the thermoelectric element 210. The heating section 211 is connected to the heat transfer pipe 22, and the heating section 211 and the heat transfer pipe 22 have internal spaces that are communicated with each other. The inner spaces of the heating section 211 and the heat transfer pipe 22 forms a circulation path where a heat medium circulates. The type of heat medium is not particularly limited, but for example, water can be used.

The cooling section 212 is formed by a metal material with excellent thermal conductivity. The cooling section 212 is formed as a plate that contacts the other side of the thermoelectric element 210. Inside the cooling section 212, there is formed a cooling water flow path through which the cooling water flows. 212a in FIG. 2 is a cooling water inlet for connecting a cooling water inlet pipe (not shown), and 212b in FIG. 2 is a cooling water outlet for connecting a cooling water outlet pipe (not shown). That is, the cooling water flowing in the cooling water flow path inside the cooling section 212 flows in from the cooling water inlet 212a and is discharged from the cooling water outlet 212b. The type of cooling water is not particularly limited, but water can be used for example.

(Storage Tank 30)

The storage tank 30 stores the heat medium used in the heating section 211 of the thermoelectric power generation unit 20, and is connected to the heating section 211 via a communicating pipe 40. That is, the heating section 211 and the storage tank 30 are in a state of being communicated via the communicating pipe 40. Depending on the situation, the storage tank 30 supplies the heat medium to the heating section 211 or recovers the heat medium from the heating section 211. In the present embodiment, there is exemplified the configuration where one storage tank 30 is provided in the thermoelectric power generator 10, but a plurality of storage tanks 30 may be provided in the thermoelectric power generator 10.

Further, a heater 31 and a cooler (cooling section) 32 are connected to the storage tank 30. That is, the storage tank 30 has a heating function to heat, with the heater 31, the heat medium inside the storage tank 30, and a cooling function to cool, with the cooler 32, the heat medium inside the storage tank 30. The cooling function is so made as to be turned on and off depending on a pressure in the storage tank 30. In the example shown in FIG. 1, the cooler 32 is configured so as to provide a solenoid valve 321 in the circulation path of the cooling water (for example, cooling water), and to control, with a pressure switch 322, the solenoid valve 321 to open and close. Specifically, the pressure switch 322, with the pressure in the storage tank 30 (storage tank pressure) being a set pressure Pset or more, opens the solenoid valve 321 thereby to circulate the cooling water (cooling function ON), whereas, with the storage tank pressure being less than the set pressure Pset, closes the solenoid valve 321 thereby to stop the circulation of the cooling water (cooling function OFF).

Since the storage tank 30 is communicated with the heating section 211 via the communicating pipe 40, all of these internal pressures are the same. Due to this, the pressure switch 322 may be mounted to the communicating pipe 40 or to the heating section 211 of the thermoelectric power generation unit 20, instead of the storage tank 30.

(Basic Operation of Thermoelectric Power Generator 10)

The thermoelectric power generator 10 uses the same principle as in Patent Document 1 thereby to improve a power generation amount. The conventional thermoelectric power generator is configured so as to flow a hot liquid or a hot gas as the heat medium through the circulation path. In this configuration, the heat medium flowing in the circulation path causes a sensible heat change due to the same phase. That is, the heat medium changes in temperature in the process of flowing through the circulation path.

Contrary to this, with the thermoelectric power generator 10 according to the present embodiment, the heat medium, in the process of the heat medium circulating the circulation path of the heating section 211 and the heat transfer pipe 22, is subjected to the latent heat change (for example, phase change from gas to liquid) thereby to keep the heat medium temperature constant and improve the power generation amount.

Figure 4:
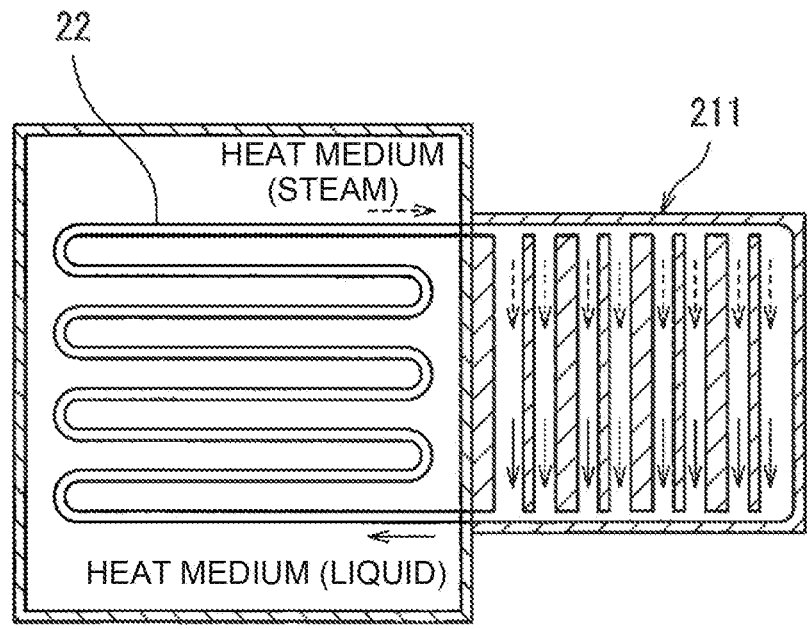
FIG. 4 schematically shows a circulation path formed by a heating section and a heat transfer pipe.

FIG. 4 schematically shows the heat medium's circulation path formed by the heating section 211 and the heat transfer pipe 22. In this circulation path, as shown in FIG. 4, the heat medium is heated by the heat supplied in the heat transfer pipe 22, and the heat medium flowing in the heat transfer pipe 22 turns from liquid to steam. That is, the heat medium evaporates in the heat transfer pipe 22, changing in phase from liquid to gas. The steam is discharged to the heating section 211 from the heat transfer pipe 22's open end section at the high side position. The steam discharged to the heating section 211, while being poured onto a heating face of the heating section 211, falls down the internal circulation path in the gravitational direction, and is condensed by radiating heat from the heating face and heating the thermoelectric element 210. That is, the heat medium changes in phase from gas to liquid in the heating section 211. In this case, the heat medium causes the latent heat change, and the condensation heat medium temperature is constant. The condensed heat medium flows into the heat transfer pipe 22 from the heat transfer pipe 22's open end section on the low side. The heat medium having flown into the heat transfer pipe 22 is heated again and changes in phase from liquid to steam. Further, it is preferable that, for accomplishing transferring of the heat medium in liquid phase, the communicating pipe 40 that communicates the storage tank 30 with the thermoelectric power generation unit 20 be connected to the thermoelectric power generation unit 20 at a low position where the heat medium is in the liquid phase.

In this way, the heat medium, in the thermoelectric power generator 10, naturally circulates through the circulation path formed by the heating section 211 and the heat transfer pipe 22. That is, this circulation path functions as a thermosiphon heat exchanger (heat exchanger) that, without using a pump or other power source, utilizes the phase change of the heat medium thereby to repeatedly circulate the heat medium.

Further, for circulating the heat medium in a state of being subjected to the latent heat change in the circulation path formed by the heating section 211 and the heat transfer pipe 22, controlling the pressure of the heat medium is important from the viewpoint of improving the power generation amount. In the thermoelectric power generator 10, supplying the heat medium from the storage tank 30 to the heating section 211 and recovering the heat medium from the heating section 211 can control the pressure of the heat medium.

Specifically, at the time of operating the thermoelectric power generator 10 (when being used as the thermoelectric power generation system, to be described below), the storage tank 30, while ordinarily heating the heat medium with the heater 31, turns on and off the cooling function by the cooler 32 thereby to control the pressure of the heat medium. That is, in the thermoelectric power generator 10, the storage tank 30 including the heater 31 and cooler 32 serves as a heat medium pressure control mechanism. As described above, the heating section 211 and the storage tank 30 are communicated via the communicating pipe 40, so the internal pressure is the same; when the pressure of the heating section 211 decreases, the storage tank pressure decreases as well, whereas when the pressure of the heating section 211 increases, the storage tank pressure increases as well.

When the storage tank pressure becomes the set pressure Pset or more, the cooling function of the cooler 32 is turned on, thereby to decrease the storage tank pressure, and the heat medium moves from the thermoelectric power generation unit 20 to the storage tank 30 (the heat medium transferring to the storage tank). Meanwhile, when the storage tank pressure becomes less than the set pressure Pset, the cooling function of the cooler 32 is turned off, thereby to increase the storage tank pressure, and the heat medium moves from the storage tank 30 to the thermoelectric power generation unit 20 (the heat medium returning from the storage tank). With the above operations, the pressure of the heat medium in the thermoelectric power generation unit 20 (and the storage tank 30) is so controlled as to maintain the set pressure Pset.

The thermoelectric power generation system using the thermoelectric power generator 10 may cause a fluctuation in the gas temperature as a heat source. Even when the heat source gas temperature (heat source temperature) should cause the fluctuation in this way, the thermoelectric power generator 10, which has the heat medium pressure control mechanism, maintains the heat medium pressure at the set pressure Pset, thereby making it possible to maintain the heat medium temperature at a saturation temperature that is equivalent to the set pressure Pset.

Figure 5:
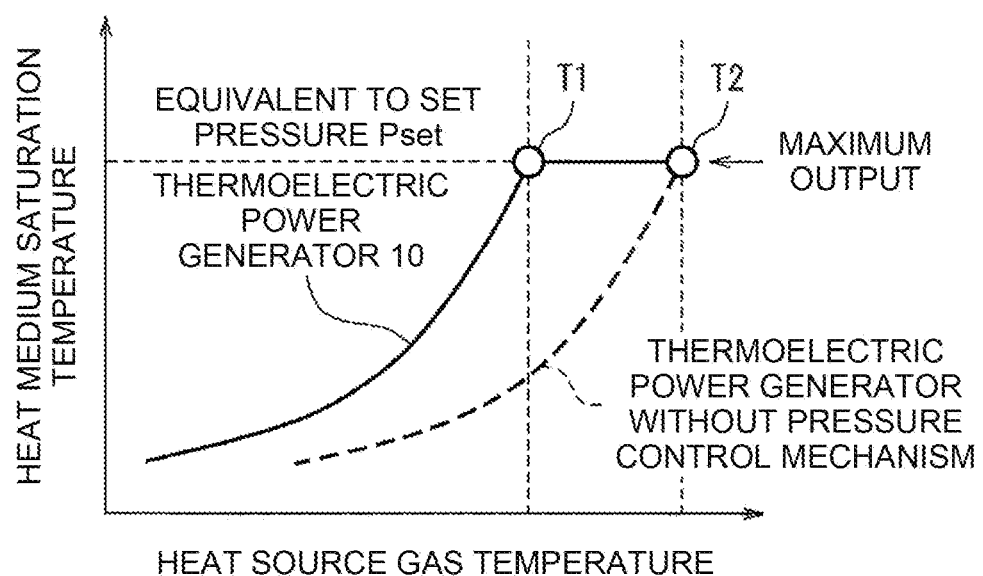
FIG. 5 is a graph showing a relation between a heat source gas temperature and a heat medium saturation temperature.

That is, as shown in the solid line in FIG. 5, in the thermoelectric power generator 10, despite the heat medium gas temperature fluctuating between a temperature T1 and a temperature T2, a heat medium saturation temperature does not fluctuate, making it possible to maintain the maximum output between the temperature T1 and the temperature T2. Meanwhile, in a thermoelectric power generator without the heat medium pressure control mechanism, the heat medium saturation temperature fluctuates according to the change in the temperature of the heat source gas, as shown by the dashed line in FIG. 5, failing to accomplish the maximum output in most cases. In the example of thermoelectric power generator 10 shown in FIG. 5, when the heat source gas temperature moves from the temperature T1 to the temperature T2, the heat medium moves from the thermoelectric power generation unit 20 to the storage tank 30 thereby to maintain the set pressure Pset, whereas when the heat source gas temperature moves from the temperature T2 to the temperature T1, the heat medium moves from the storage tank 30 to the thermoelectric power generation unit 20 thereby to maintain the set pressure Pset.

(Thermoelectric Power Generation System)

Then, the thermoelectric power generation system to which the thermoelectric power generator 10 is applied will be described, by citing <Example 1> to <Example 14>.

Example 1

Figure 6:
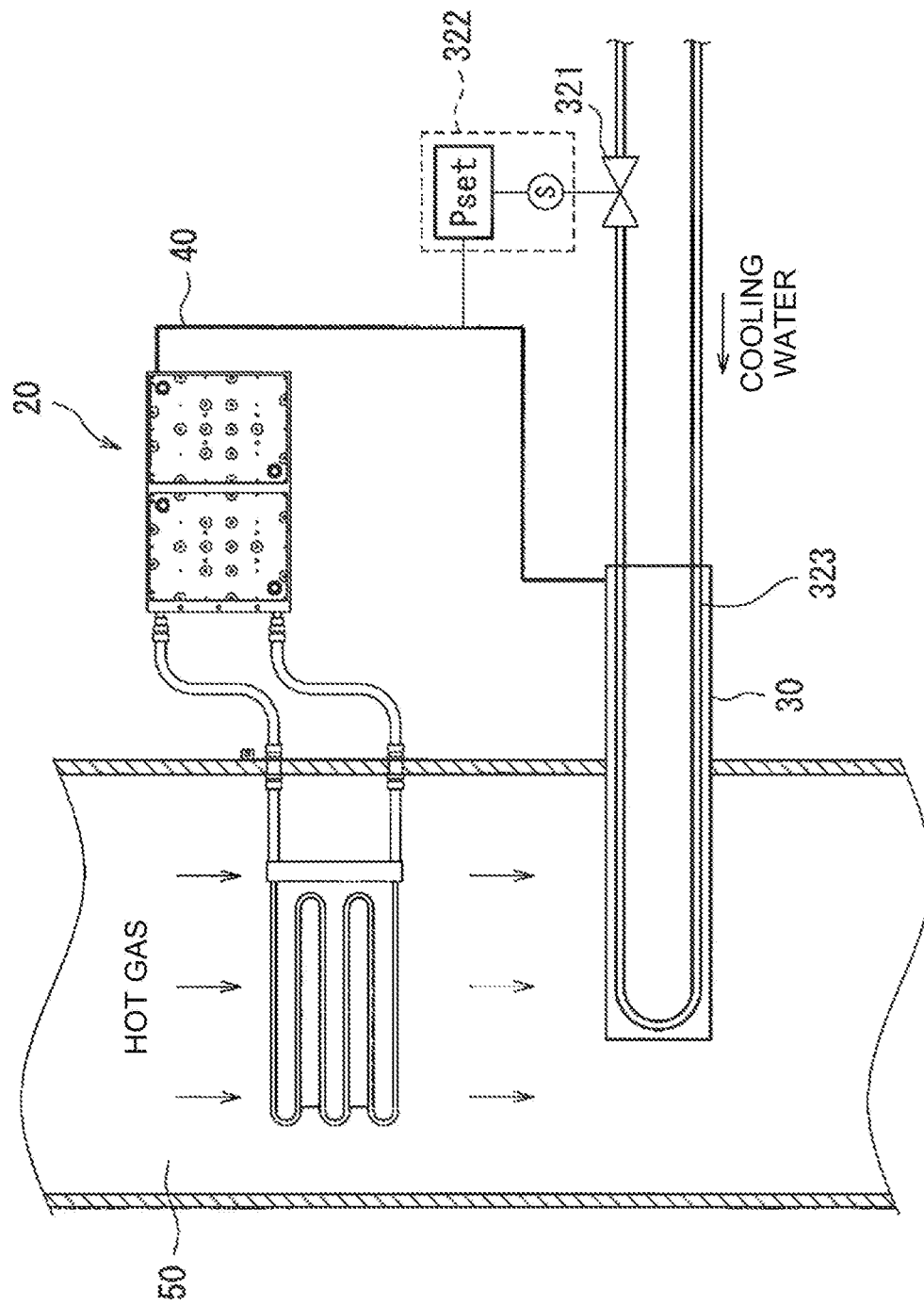
FIG. 6 schematically shows a configuration of Example 1 of the thermoelectric power generation system.

The thermoelectric power generation system according to the present embodiment (hereinafter referred to as "the present system"), with a hot gas heat as the heat source, gives, to the thermoelectric module, the recovery heat from the hot gas by means of the thermo-siphon heat exchanger (heating section 211 and heat transfer pipe 22) thereby to generate electricity. FIG. 6 schematically shows a configuration of Example 1 of the present system. In the present system, the heat transfer pipe 22 of the thermoelectric power generator 10 is placed in a flow path 50 where the hot gas flows (heating flow path), and the heat of the hot gas flowing through the flow path 50 is used thereby to heat the heat medium. The flow path 50 here can be an exhaust gas duct of an engine, or a duct through which exhaust gas generated in an industrial waste furnace or a biomass boiler flows.

Further, in the present system, at least a part of the storage tank 30 is placed in the flow path 50. As a result, during the operation of the present system, the heat medium in the storage tank 30 is ordinarily heated by the hot gas flowing through the flow path 50. That is, in the present system, the flow path 50 through which the hot gas flows corresponds to the heater 31 in FIG. 1. It may be configured so that, when the hot gas flowing through the flow path 50 is a corrosive gas or the like, burying or bonding the storage tank 30 to a component material of the duct forming the flow path 50 protects the storage tank 30 from the corrosive gas.

In the present system, the configuration where at least a part of the storage tank 30 is placed in the flow path 50 is one of the features of the present invention, and is common to not only Example 1 but also to all Examples described below. In this way, placing at least a part of the storage tank 30 in the flow path 50 eliminates the need for placing any other heating unit (such as a heater or heating heat exchanger) as the heater 31 of the storage tank 30, making it possible to downsize the thermoelectric power generator 10. "The configuration where at least a part of the storage tank 30 is placed in the flow path 50" includes the case where a plurality of storage tanks 30 is placed in the thermoelectric power generator 10, and any of the storage tanks 30 is placed in the flow path 50.

The present system shown in FIG. 6 is configured so that a cooling water flow path pipe 323, which functions as the cooler 32, is placed in the storage tank 30, and the cooling water flow in the cooling water flow path pipe 323 is controlled with the solenoid valve 321 and the pressure switch 322 thereby to turn on and off the cooling function.

Example 2

Figure 7:
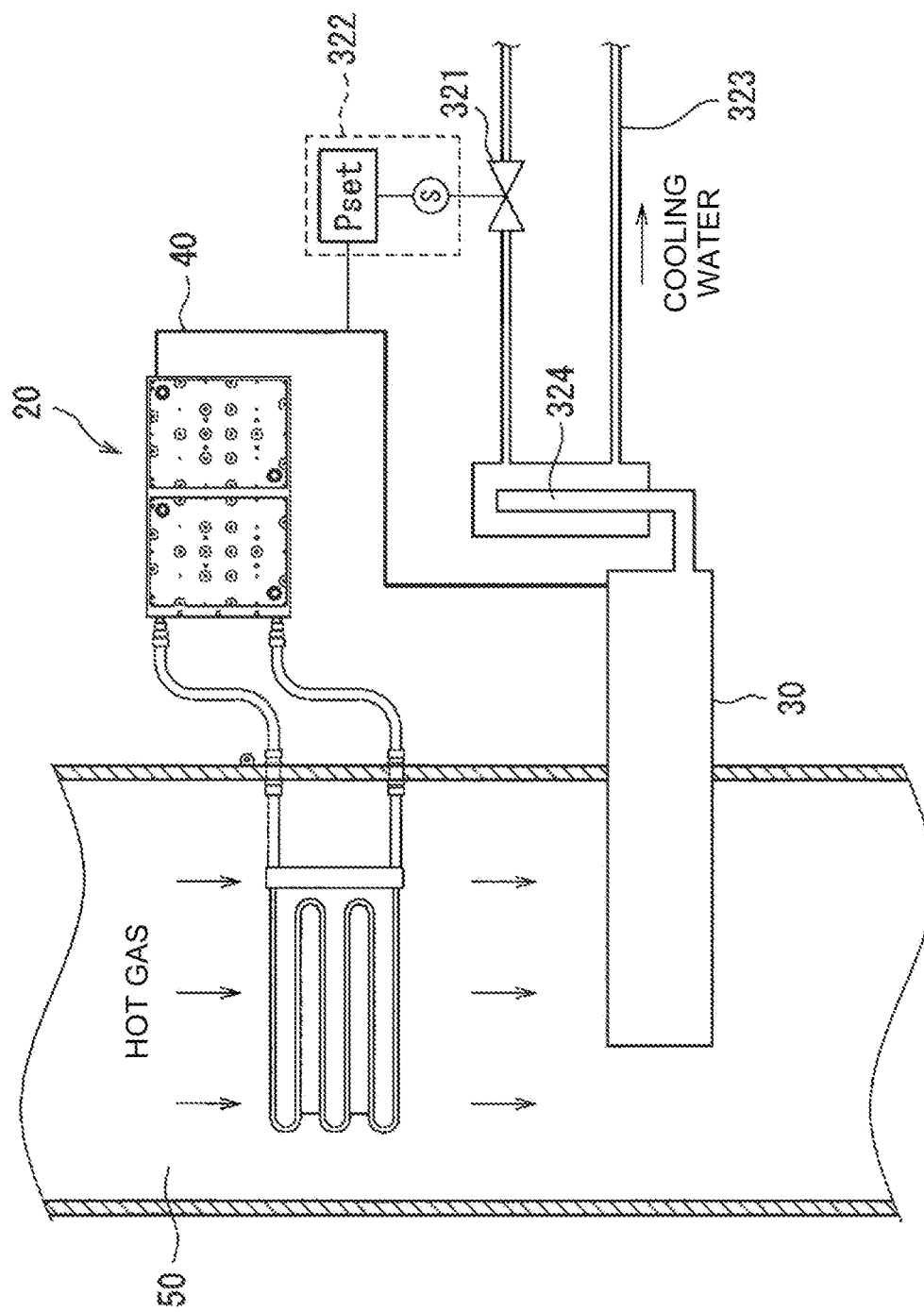
FIG. 7 schematically shows a configuration of Example 2 of the thermoelectric power generation system.

FIG. 7 schematically shows a configuration of Example 2 of the present system. Since the inside of the storage tank 30 becomes extremely hot during the operation of the present system, in the configuration where the cooling water flow path pipe 323 is placed inside the storage tank 30, as in Example 1, the cooling water evaporates in the cooling water flow path pipe 323, making it difficult to feed the cooling water to the cooling water flow path pipe 323, which may cause a concern such as making the cooling function unstable or decreasing the cooling efficiency.

Example 2 is designed so as to stabilize the cooling function for the cooler 32. That is, in the present system, the cooler 32 performs the cooling on the storage tank 30 from the outside, not the inside. As a specific example, as shown in FIG. 7, a heat pipe 324 with one end connected to the storage tank 30 is provided outside the flow path 50, so that the other end side of the heat pipe 324 can be cooled with the cooler 32.

In this way, the cooler 32, by performing the cooling on the storage tank 30 from the outside, makes the cooling water less likely to evaporate in the cooling water flow path pipe 323, making it possible to stabilize the cooling function and improve the cooling efficiency.

Example 3

Figure 8:
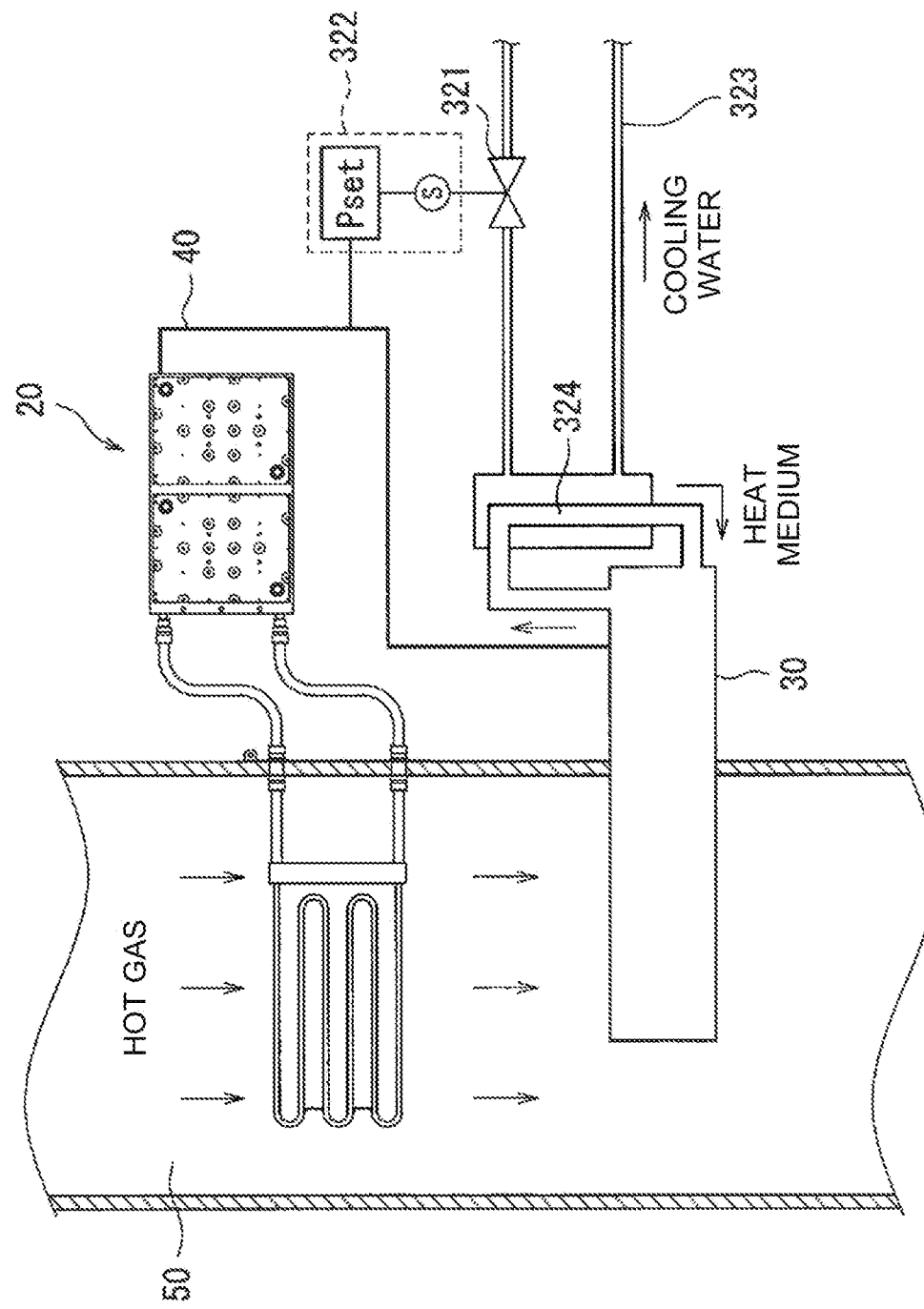
FIG. 8 schematically shows a configuration of Example 3 of the thermoelectric power generation system.

FIG. 8 schematically shows a configuration of Example 3 of the present system. Example 3 is a modification of the system of Example 2; as shown in FIG. 8, both ends of the heat pipe 324 are connected to the storage tank 30, and the heat pipe 324 forms a loop circuit in the height direction.

In this way, the heat pipe 324 forming the loop circuit in the height direction circulates the to-be-cooled heat medium in the heat pipe 324 by the thermo-siphon effect, making it possible to improve the cooling efficiency at the time when the cooling function is turned on.

Example 4

Figure 9:
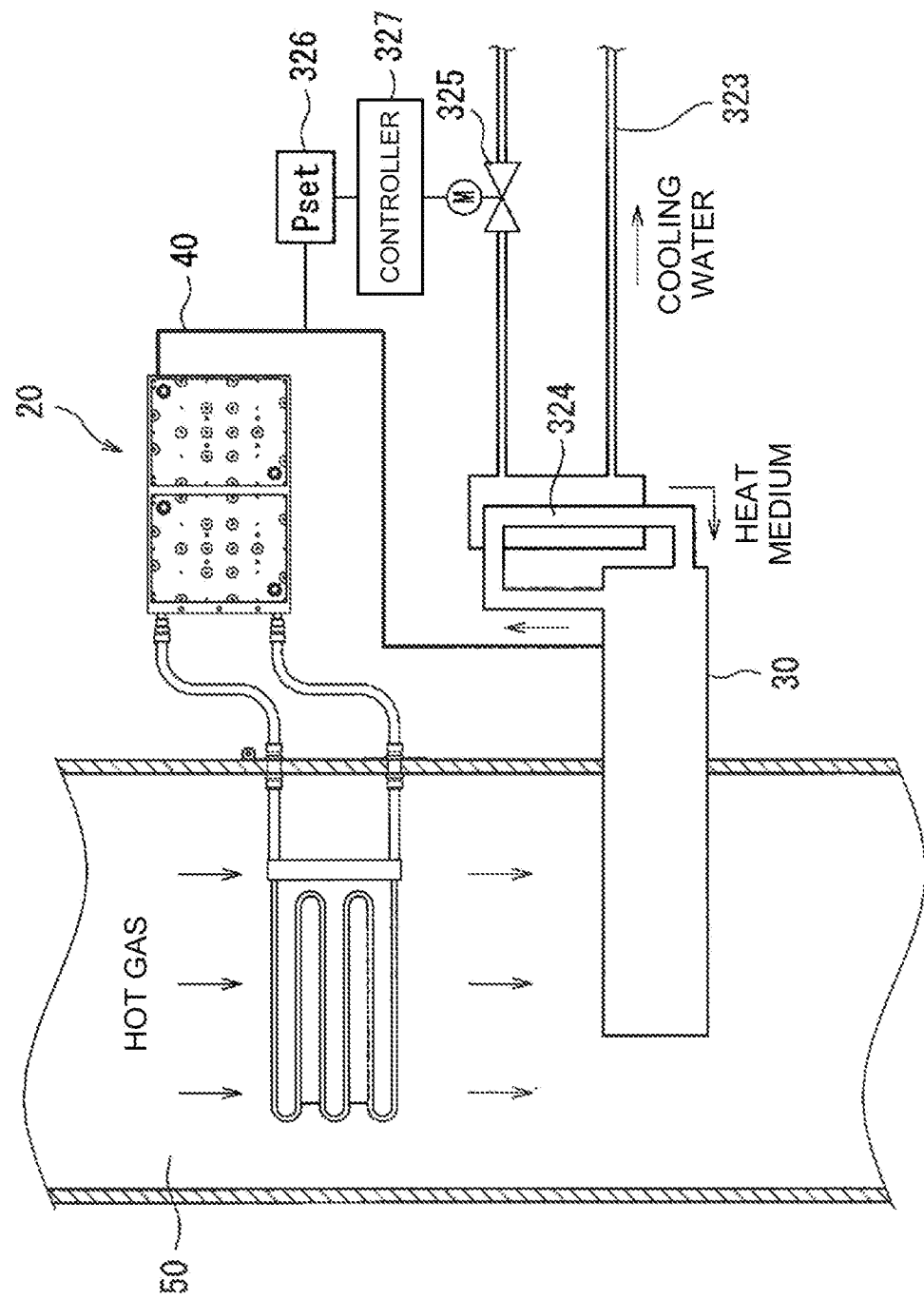
FIG. 9 schematically shows a configuration of Example 4 of the thermoelectric power generation system.

FIG. 9 schematically shows a configuration of Example 4 of the present system. In Examples 1 to 3, the cooler 32 is configured so as to control the opening and closing of the solenoid valve 321 by means of the pressure switch 322 thereby to turn the cooling function on and off.

In contrast, Example 4 has a configuration where a cooling water flowrate adjustment function is added to the cooler 32. As a specific example, as shown in FIG. 9, a variable control valve 325 is provided in place of the solenoid valve 321, a pressure sensor 326 and a controller 327 are provided in place of the pressure switch 322, and the controller 327 controls the opening degree of the variable control valve 325 according to a detection result of the pressure sensor 326. That is, in Example 4, as the storage tank pressure detected by the pressure sensor 326 increases, the opening degree of the variable control valve 325 is increased thereby to increase the flowrate of the cooling water, making it possible to increase the cooling function of the cooler 32. As the storage tank pressure decreases, the opening degree of the variable control valve 325 is decreased thereby to decrease the flowrate of the cooling water, making it possible to decrease the cooling function of the cooler 32. In this way, having the cooling water flowrate adjustment function in the cooler 32 can perform, with higher accuracy, the pressure control of the heat medium in the thermoelectric power generator 10.

In the example shown in FIG. 9, the flowrate of the cooling water is adjusted by adjusting the opening degree of the variable control valve 325, but the present invention is not limited to this. For example, such a configuration in allowed as in which the cooler 32 includes a cooling water pump (not shown) that circulates the cooling water, and an operating frequency of the cooling water pump is adjusted by the controller 327. In this case, increasing the operating frequency of the cooling water pump can increase the flowrate of the cooling water, whereas decreasing the operating frequency can decrease the flowrate of the cooling water.

The above feature is applied to FIG. 9 as a modification of Example 3 (FIG. 8), but can also be applied as modifications of Examples 1 and 2 (FIGS. 6 and 7).

Example 5

Figure 10:
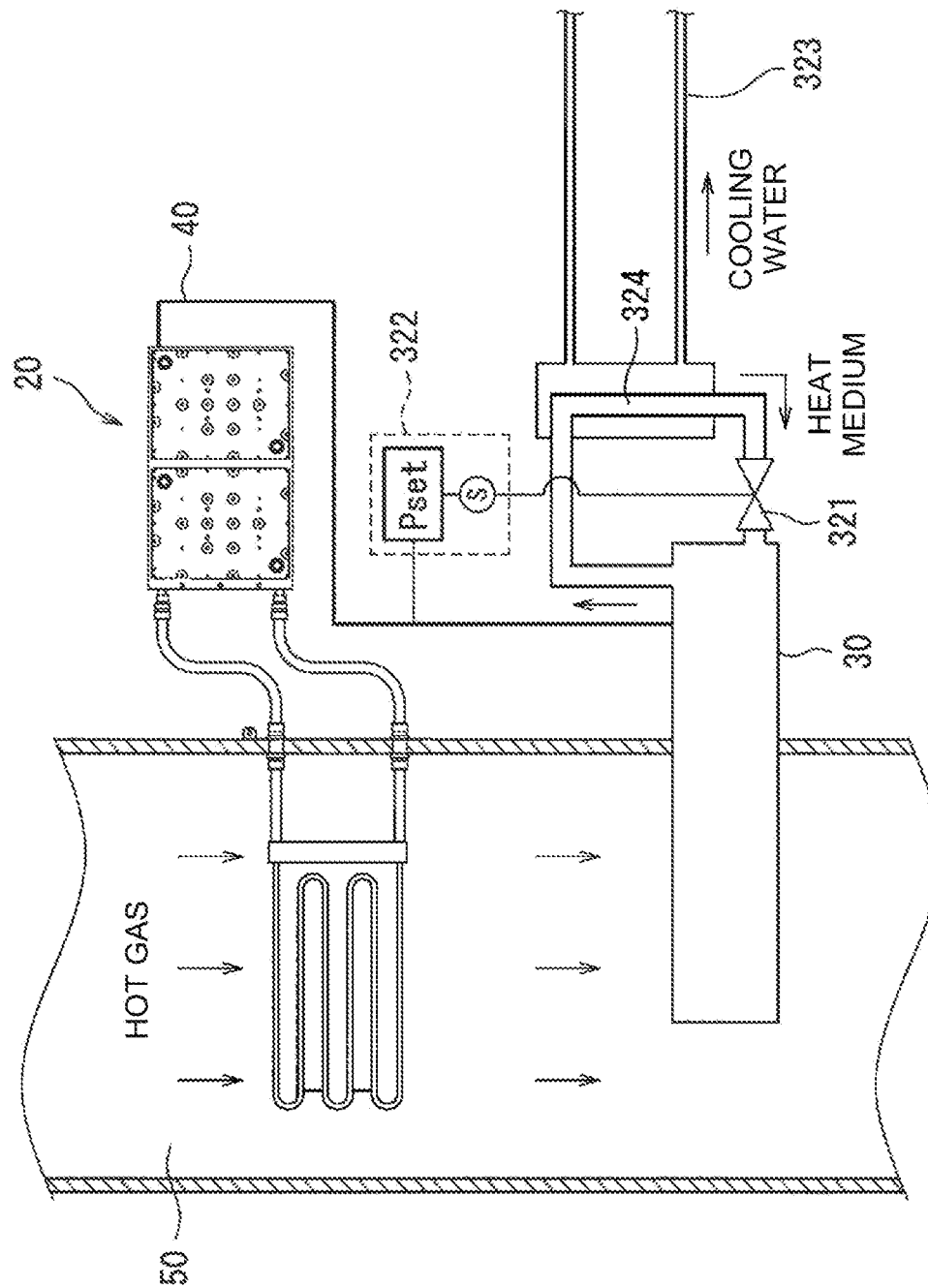
FIG. 10 schematically shows a configuration of Example 5 of the thermoelectric power generation system.

FIG. 10 schematically shows a configuration of Example 5 of the present system. Example 5 is a modification of the system of Example 3, and, as shown in FIG. 10, the solenoid valve 321 is provided in the heat pipe 324, not the cooling water flow path pipe 323. In this way, providing solenoid valve 321 in the heat pipe 324, and stopping the circulation of the heat medium in the heat pipe 324 can also turn off the cooling function.

In the case of circulating and stopping the cooling water thereby to turn on and off the cooling function, the cooling water that has stopped circulating at the time of the cooling function being turned off is heated for a long time, leaving a fear of steaming in the cooling water flow path pipe 323. Contrary to this, the configuration of circulating and stopping the heat medium in the heat pipe 324 thereby to turn on and off the cooling function eliminates the need for stopping the circulation of the cooling water, making it possible to prevent the steaming of the cooling water.

The present system shown in FIG. 10 is exemplified as the modification of Example 3 (FIG. 8), with the heat pipe 324 forming a loop circuit. However, the present invention is not limited to this, and, as a modification of Example 2 (FIG. 7), may have a configuration where the heat pipe 324 does not form the loop circuit. In this case, the solenoid valve 321, in the heat pipe 324, should be provided between a cooling point by the cooler 32 and the storage tank 30. This also can stop the heat medium's movement between the cooling point by the cooler 32 and the storage tank 30, making it possible to turn off the cooling function.

Further, FIG. 10 shows the configuration using the solenoid valve 321 and pressure switch 322 as the modification of Example 3; the present invention is, however, not limited to this, and may have a configuration using the variable control valve 325, the pressure sensor 326, and the controller 327 as in Example 4.

Example 6

Figure 11:
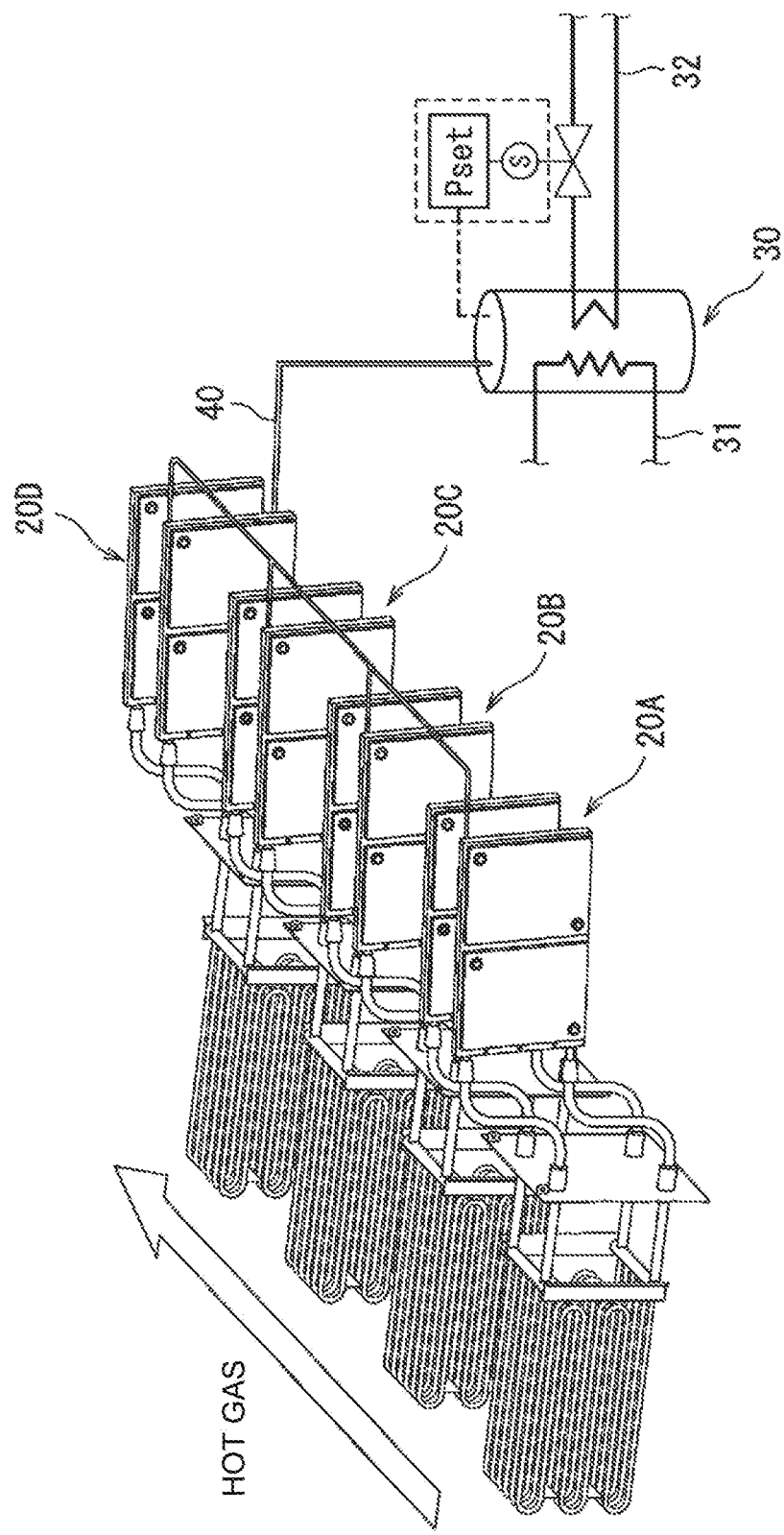
FIG. 11 schematically shows a configuration of Example 6 of the thermoelectric power generation system.

FIG. 11 schematically shows a configuration of Example 6 of the present system. In each of above Examples, the thermoelectric power generator 10 is configured in a manner to include a combination of the one thermoelectric power generation unit 20 with the one storage tank 30. Contrary to this, the thermoelectric power generator 10 of Example 6 is configured in a manner to include a combination of a plurality of thermoelectric power generation units 20 (four in the example of FIG. 11) with the one storage tank 30. In the example of FIG. 11, the four thermoelectric power generation units 20 are placed along the flow direction of the hot gas as the heat source, with a thermoelectric power generation unit 20A to a thermoelectric power generation unit 20D in order from the upstream side in the flow direction of the hot gas. In this way, providing a plurality of thermoelectric power generation units 20 allows the thermoelectric power generator 10 to increase a power generation output.

In Example 6, the heating sections 211 in all of the plurality of thermoelectric power generation units 20 are connected by a unit communicating pipe 214. That is, the connecting at the unit communicating pipe 214 equalizes pressures in the plurality of thermoelectric power generation units 20. In this case, it is preferable that the unit communicating pipe 214 connects the units at a high position, in the thermoelectric power generation unit 20, where the heat medium is in the steam phase. This makes it possible to control the total amount of the heat medium in the thermoelectric power generator 10 with the one storage tank 30 for a plurality of thermoelectric power generation units 20, making it possible to simplify the configuration of the thermoelectric power generator 10 with the power generation output increased.

In Example 6, it is sufficient that the communicating pipe 40 is connected to at least one of a plurality of thermoelectric power generation units 20; in the example of FIG. 11, the communicating pipe 40 is connected to the most downstream thermoelectric power generation unit 20D. To the system of Example 6, any of the configurations of Examples 1 to 5 can be applied as the configuration of the storage tank 30.

Example 7

Figure 12:
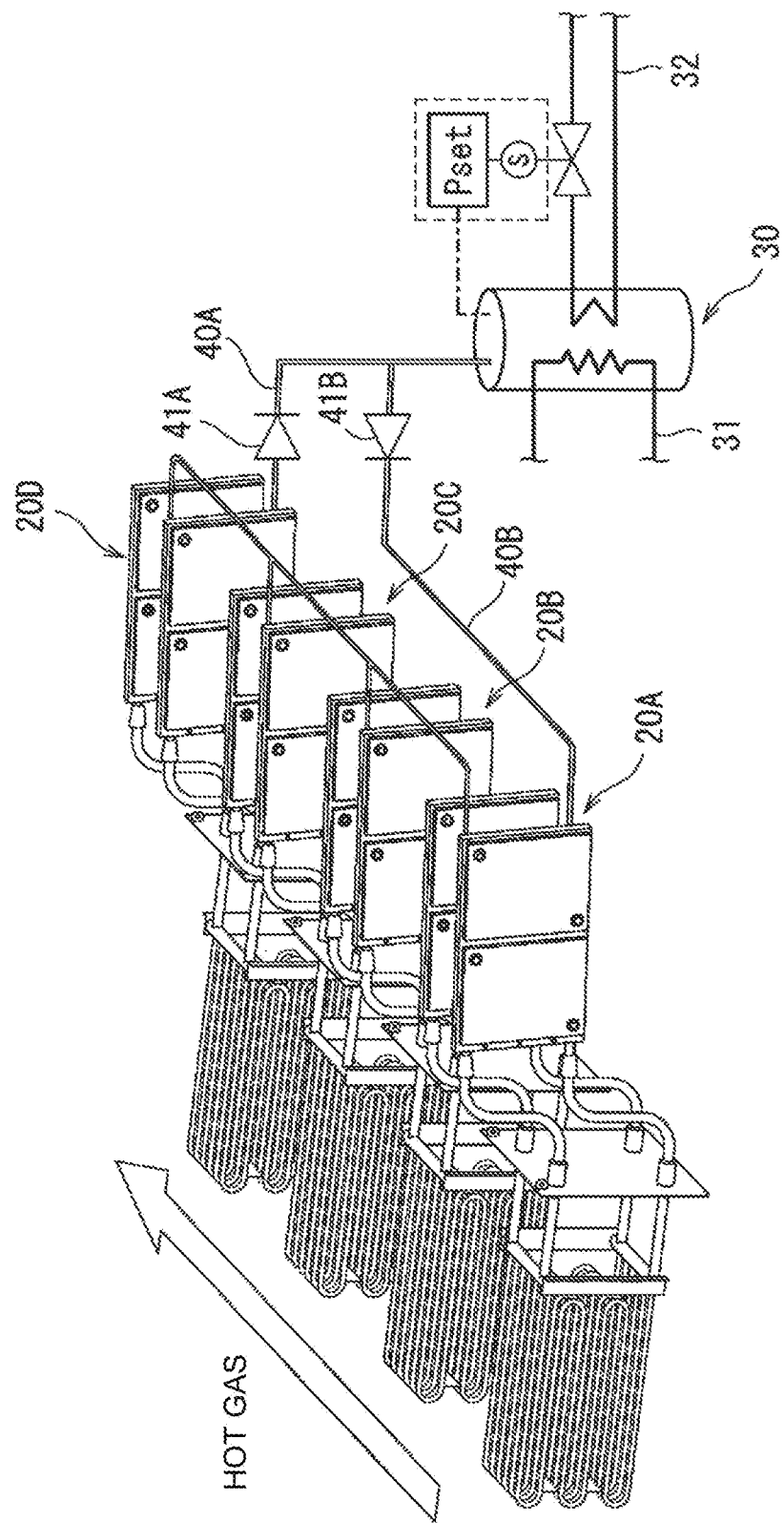
FIG. 12 schematically shows a configuration of Example 7 of the thermoelectric power generation system.

FIG. 12 schematically shows a configuration of Example 7 of the present system. Example 7 is a modification of the system in Example 6. In Example 6 (FIG. 11), the communicating pipe 40 is connected to only one unit on the thermoelectric power generation unit 20 side (the most downstream thermoelectric power generation unit 20D). Contrary to this, in the system of Example 7, as shown in FIG. 12, the communicating pipe 40 is branched into two on the thermoelectric power generation unit 20 side, with the one branch communicating pipe 40A connected to the most downstream thermoelectric power generation unit 20D and the other branch communicating pipe 40B connected to the most upstream thermoelectric power generation unit 20A. Further, the branch communicating pipe 40A includes a check valve 41A that prohibits the heat medium's movement from the storage tank 30 to the thermoelectric power generation unit 20D, and the branch communicating pipe 40B includes a check valve 41B that prohibits the heat medium's movement from the thermoelectric power generation unit 20A to the storage tank 30.

In the system of Example 7, the check valves 41A and 41B are provided on the branch communicating pipes 40A and 40B, respectively; thereby, when the heat medium is recovered in the storage tank 30 (with the storage tank pressure>the set pressure Pset and the cooling function turned on), the heat medium moves from the most downstream thermoelectric power generation unit 20D to the storage tank 30. Conversely, with the storage tank pressure<the set pressure Pset and the cooling function turned off, the heat medium moves from the storage tank 30 to the most upstream thermoelectric power generation unit 20A. This configuration is effective for eliminating an uneven distribution of the heat medium in the most downstream thermoelectric power generation unit 20D.

When a plurality of thermoelectric power generation units 20 are placed along the flow direction of the hot gas as the heat source, the hot gas as the heat source loses the heat from the upstream thermoelectric power generation units 20 in order, thereby decreasing the temperature as the hot gas moves downstream. As a result, in the example shown in FIG. 12, the most downstream thermoelectric power generation unit 20D tends to be in a liquid-rich state (a state where the total amount of the heat medium is large), whereas the most upstream thermoelectric power generation unit 20A tends to be in a steam-rich state (a state where the total amount of the heat medium is small).

In this regard, with the system of Example 7; in the state of recovering the heat medium in the storage tank 30, the heat medium can be moved from the most downstream thermoelectric power generation unit 20D where the total amount of the heat medium is large, whereas in the state where the heat medium is supplied from the storage tank 30, the heat medium can be moved to the most upstream thermoelectric power generation unit 20A where the total amount of the heat medium is small. As a result, an uneven distribution of the heat medium in the most downstream thermoelectric power generation unit 20D can be eliminated.

Example 8

Figure 13:
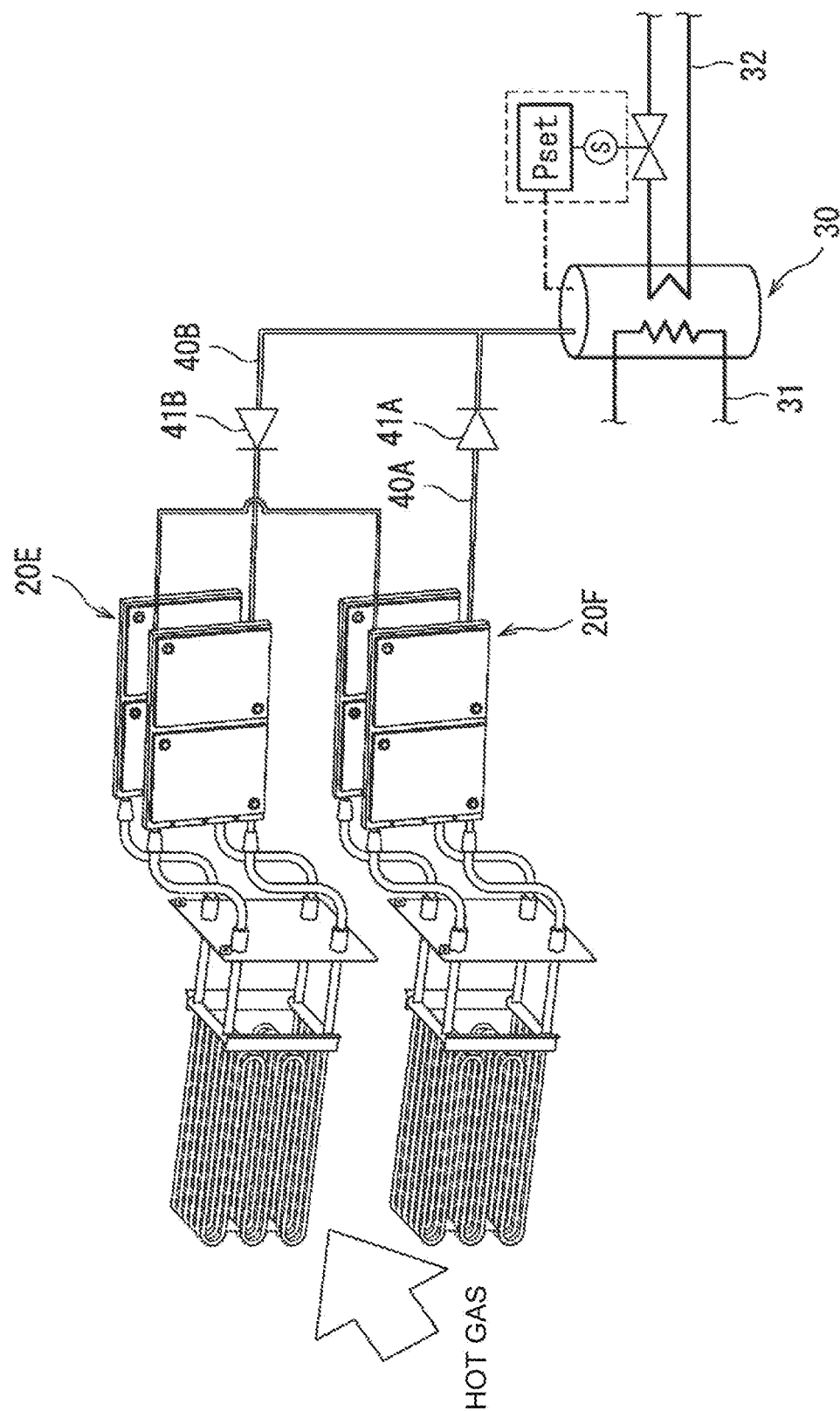
FIG. 13 schematically shows a configuration of Example 8 of the thermoelectric power generation system.

FIG. 13 schematically shows a configuration of Example 8 of the present system. Same as in Examples 6 and 7, the thermoelectric power generator 10 of Example 8 includes a combination of a plurality of thermoelectric power generation units 20 (two in the example of FIG. 13) and the one storage tank 30. However, a plurality of thermoelectric power generation units 20 is not placed along the flow direction of the hot gas as the heat source, but placed in a row in the height direction (at different heights). In the example shown in FIG. 13, the upper (placed higher) unit is the thermoelectric power generation unit 20E, and the lower (placed lower) unit is the thermoelectric power generation unit 20F.

In the system of Example 8 as well, the communicating pipe 40 is branched into two on the thermoelectric power generation unit 20 side, with the one branch communicating pipe 40A connected to the lower thermoelectric power generation unit 20F, and the other branch communicating pipe 40B connected to the upper thermoelectric power generation unit 20E. The check valve 41A to prohibit the heat medium's movement from the storage tank 30 to the thermoelectric power generation unit 20F is provided in the branch communicating pipe 40A, and the check valve 41B to prohibit the heat medium's movement from the thermoelectric power generation unit 20E to the storage tank 30 is provided in the branch communicating pipe 40B. This configuration is effective for eliminating an uneven distribution of the heat medium in the thermoelectric power generation unit 20F which is placed in the low position.

When a plurality of thermoelectric power generation units 20 are placed in a row in the height direction, despite the hot gases hitting respective thermoelectric power generation units 20 being the same in temperature, the heat medium in the liquid state falls due to the gravity and tends to stay in the thermoelectric power generation unit 20 at the low placing position. That is, in the example shown in FIG. 13, the lower thermoelectric power generation unit 20F tends to be in a liquid-rich state (the total amount of the heat medium is large), whereas the upper thermoelectric power generation unit 20E tends to be in a steam-rich state (the total amount of the heat medium is small).

In this regard, with the system of Example 8; in the state of recovering the heat medium in the storage tank 30, the heat medium can be moved from the lower thermoelectric power generation unit 20F where the total amount of the heat medium is large, whereas in the state where the heat medium is supplied from the storage tank 30, the heat medium can be moved to the upper thermoelectric power generation unit 20E where the total amount of the heat medium is small. As a result, an uneven distribution of the heat medium in the lower thermoelectric power generation unit 20F can be eliminated.

Example 9

Figure 14:
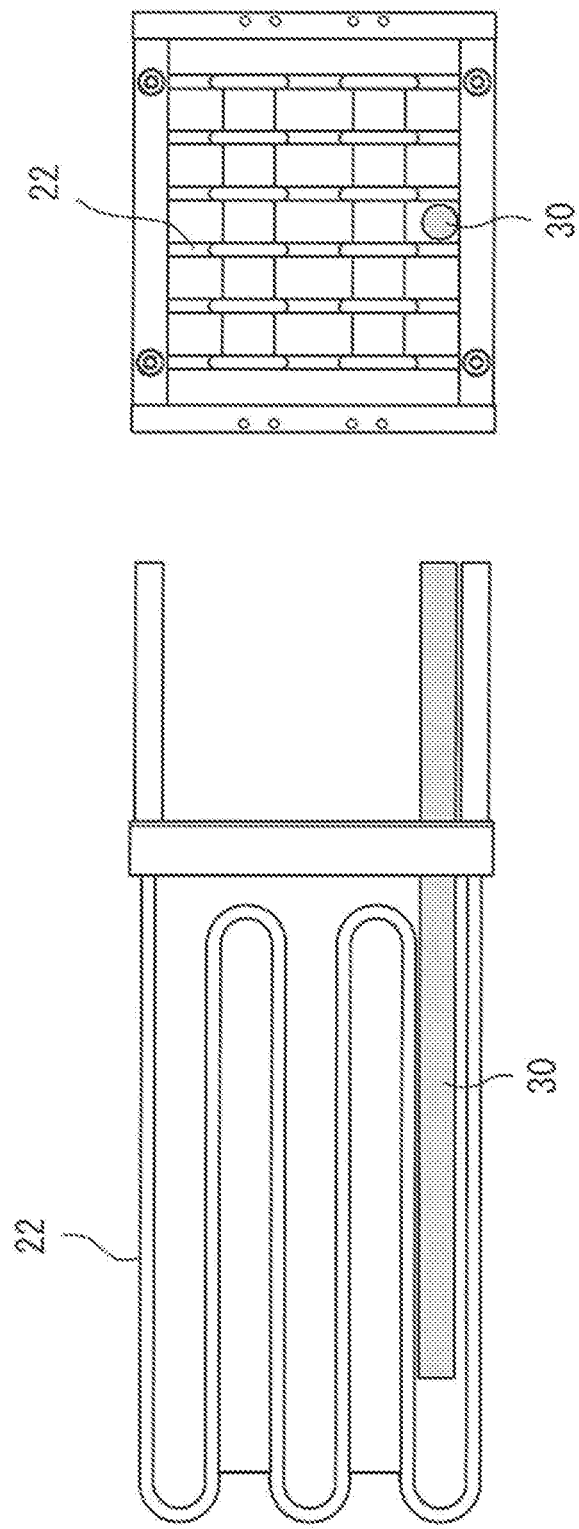
FIG. 14 shows a placing relation between the heat transfer pipe and a storage tank in Example 9 of the thermoelectric power generation system.

FIG. 14 shows a placing relation between the heat transfer pipe 22 and the storage tank 30 in Example 9 of the present system. As described above, in the present system, the heat transfer pipe 22 and (at least a part of) the storage tank 30 are placed in the flow path 50 where the hot gas flows. In this case, the storage tank 30 may be placed in such a form as to be inserted into a gap section in the heat transfer pipe 22 group, as shown in FIG. 14. Placing the storage tank 30 in this way eliminates the need for a space for placing the storage tank 30, making it possible to save the space of the thermoelectric power generator 10 in the present system.

Example 10

Figure 15:
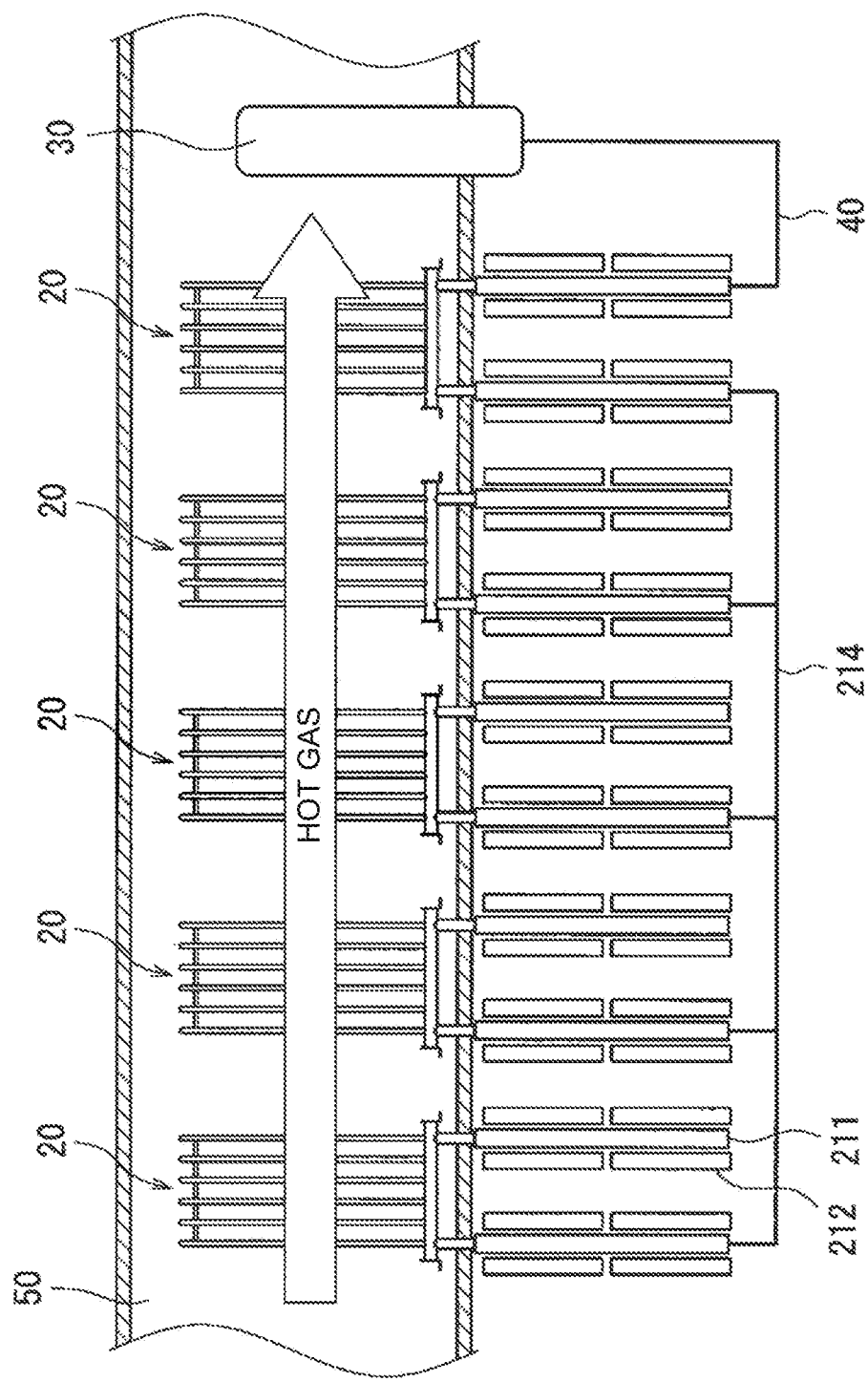
FIG. 15 shows a placing relation between the thermoelectric power generation unit and the storage tank in Example 10 of the thermoelectric power generation system.

FIG. 15 shows a placing relation between the thermoelectric power generation unit 20 and the storage tank 30 in Example 10 of the present system. FIG. 15 omits illustration of the heater 31 and cooler 32 in the storage tank 30. As described above, in the present system, (the heat transfer pipe 22 of) the thermoelectric power generation unit 20) and (at least a part of) the storage tank 30 are placed to the flow path 50.

In Example 10, the storage tank 30 is placed on the downstream side of the thermoelectric power generation unit 20, with respect to the flow direction of the hot gas in the flow path 50. That is, the storage tank 30 is placed at a position where the heat source gas temperature is lower than in the point of placing the thermoelectric power generation unit 20. This is because the gas temperature required to heat the storage tank 30 is lower than the gas temperature required to heat the thermoelectric power generation unit 20. Placing the storage tank 30 on the downstream side of the thermoelectric power generation unit 20 eliminates an influence on the thermoelectric power generation unit 20's heat recovering capability in the flow path 50.

FIG. 15 exemplifies a configuration of combining a plurality of thermoelectric power generation units 20 (five in the example of FIG. 15) with the one storage tank 30 in thermoelectric power generator 10. In this case, the storage tank 30 is placed on the downstream side of any of the thermoelectric power generation units 20. The configuration of Example 10 is not limited to the case where a plurality of thermoelectric power generation units 20 are provided in the thermoelectric power generator 10, but is also applicable to the case where the one thermoelectric power generation unit 20 is combined with the one storage tank 30 in the thermoelectric power generator 10.

Example 11

Figure 16:
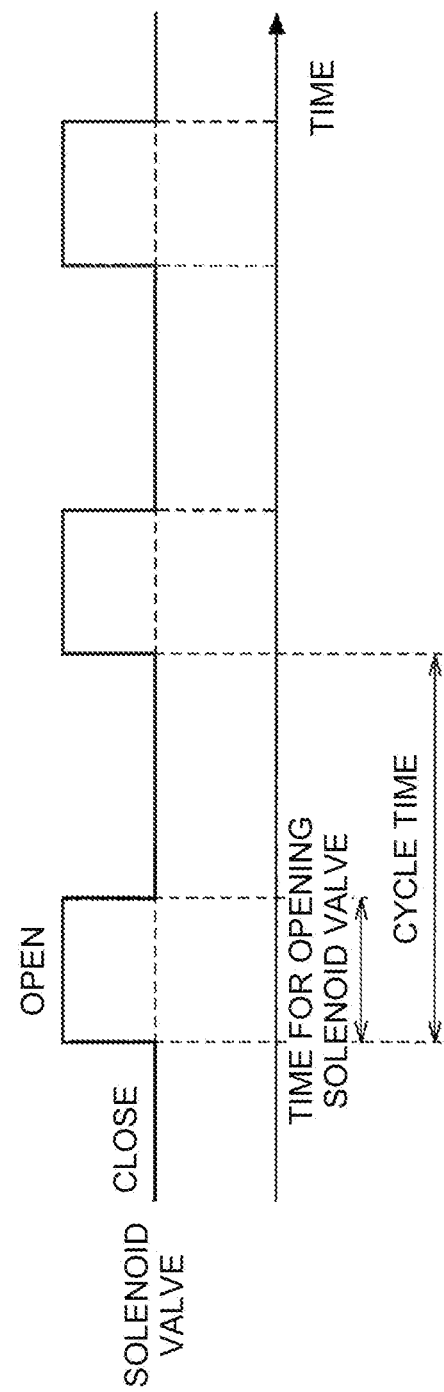
FIG. 16 is a timing chart showing the control of opening and closing of a solenoid valve in Example 11 of the thermoelectric power generation system.

Example 11 is based on the configuration of Example 7 or 8, and has a feature in the control operation of the cooling function of the storage tank 30. FIG. 16 is a timing chart showing the control of opening and closing of the solenoid valve 321 in Example 11 of the present system. With any detailed illustration omitted, the thermoelectric power generator 10 is, for performing the following opening and closing control, provided with a timer that measures time and a controller that controls the opening and closing of the solenoid valve 321 based on the measurement by the timer.

The present systems in Examples 7 and 8 are configured so that the communicating pipe 40 is branched into the two branch communicating pipes 40A and 40B on the thermoelectric power generation unit 20 side, and the check valves 41A and 41B are provided in the branch communicating pipes 40A and 40B, respectively. In this configuration, operations described in Examples 7 and 8 can eliminate an uneven distribution of the heat medium among a plurality of thermoelectric power generation units 20.

The control in Example 11 actively generates the operations described in Examples 7 and 8, and attempts to more effectively eliminate an uneven distribution of the heat medium. Specifically, as shown in FIG. 16, ON/OFF switching in the cooling function of the storage tank 30 is performed in a predetermined cycle by a timer operation (for example, switching the solenoid valve 321 open/close).

In the control shown in FIG. 16, with the solenoid valve 321 opened (at the time of ON in the cooling function), the heat medium moves, to the storage tank 30, from the thermoelectric power generation unit 20 where the heat medium tends to increase, whereas, with the solenoid valve 321 closed (at the time of OFF in the cooling function), the heat medium moves from the storage tank 30 to the thermoelectric power generation unit 20 where the heat medium tends to decrease. In this way, switching the ON/OFF in the cooling function in the predetermined cycle promotes the circulation of the heat medium between the thermoelectric power generation units 20 and the storage tank 30, making it possible to effectively eliminate an uneven distribution of the heat medium among a plurality of thermoelectric power generation units 20.

However, as described above, the basic control of switching the cooling function ON/OFF is such that the cooling function is turned ON when the storage tank pressure is the set pressure Pset or more, whereas the cooling function is turned OFF when the storage tank pressure is less than the set pressure Pset. It is conceivable that, for using this basic control in combination with the control of Example 11 (cooling function ON/OFF switching control in the predetermined cycle), the cooling function is ordinarily ON when the storage tank pressure is the set pressure Pset or more, and the control of Example 11 is performed when the storage tank pressure is less than the set pressure Pset.

Example 12

Figure 17:
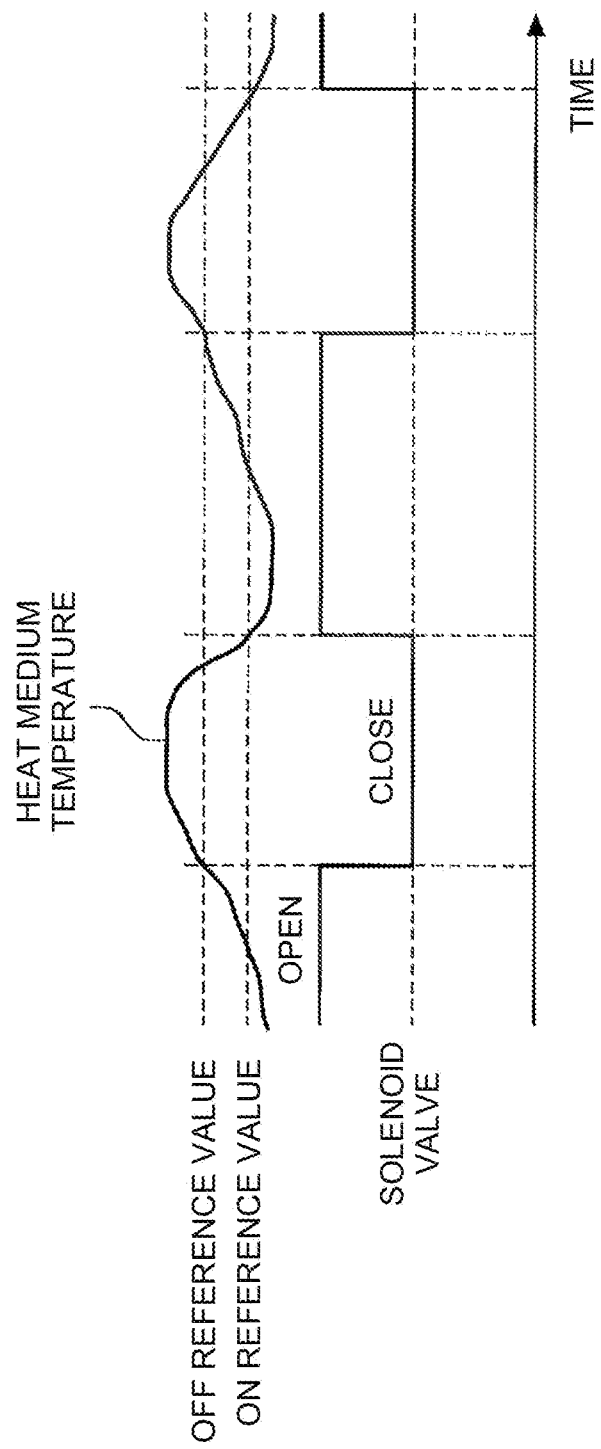
FIG. 17 is a timing chart showing the control of opening and closing of the solenoid valve in Example 12 of the thermoelectric power generation system.

Example 12, like Example 11, is based on the configuration of Example 7 or 8, and has a feature in the control operation of the cooling function of the storage tank 30. FIG. 17 is a timing chart showing the control of opening and closing of the solenoid valve 321 in Example 12 of the present system. With any detailed illustration omitted, the thermoelectric power generator 10 is, for performing the following opening and closing control, provided with a temperature sensor that detects the heat medium temperature of the thermoelectric power generation unit 20 where the heat medium tends to be insufficient, and a controller that controls the opening and closing of the solenoid valve 321 based on a detection result of the temperature sensor.

In the control of Example 12, the storage tank 30 is switched ON and OFF in the cooling function based on the heat medium temperature of the unit (placed on the upstream side of the hot gas, or placed in an upper position), among the plurality of thermoelectric power generation units 20, where the heat medium tends to be insufficient. Specifically, a temperature sensor detects the heat medium temperature of the thermoelectric power generation unit 20 where the heat medium tends to be insufficient, and as shown in FIG. 17, the detected heat medium temperature is compared with two reference values (OFF reference value and ON reference value: OFF reference value>ON reference value). Then, the cooling function is turned off (for example, the solenoid valve 321 is closed) when the heat medium temperature is over the OFF reference value, whereas the cooling function is turned on (for example, the solenoid valve 321 is opened) when the heat medium temperature is below the ON reference value. It is preferable that the temperature sensor that detects the heat medium temperature detects, in the thermoelectric power generation unit 20, the heat medium temperature at a point where the heat medium becomes the steam phase.

The heat medium temperature increases when the heat medium in the thermoelectric power generation unit 20 is insufficient; due to this, insufficiency of the heat medium can be detected by the heat medium temperature; therefore, switching ON/OFF the cooling function based on the heat medium temperature can more effectively eliminate an uneven distribution of the heat medium among a plurality of thermoelectric power generation units 20 (especially, insufficiency of heat medium in the thermoelectric power generation unit 20 where the heat medium tends to be insufficient).

Example 13

Figure 18:
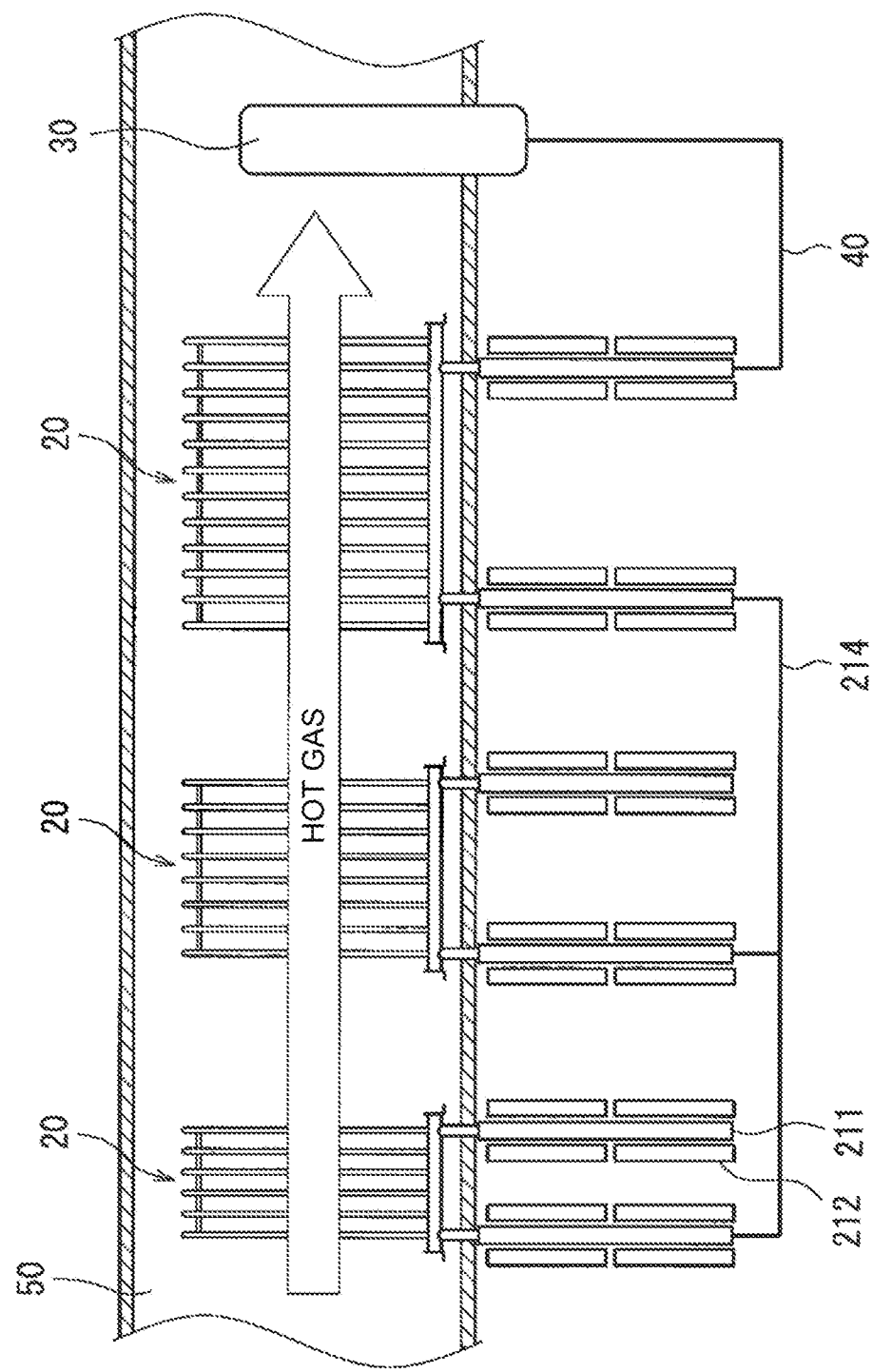
FIG. 18 shows a state of placing the thermoelectric power generation unit in Example 13 of the thermoelectric power generation system.

FIG. 18 shows a state of placing the thermoelectric power generation unit 20 in Example 13 of the present system. FIG. 18 omits illustration of the heater 31 and cooler 32 in the storage tank 30. As described above, in the present system, (the heat transfer pipe 22 of) the thermoelectric power generation unit 20) and (at least a part of) the storage tank 30 are placed to the flow path 50.

In Example 13, it is assumed that a plurality of thermoelectric power generation units 20 (three in the example of FIG. 18) is placed along the flow direction of the hot gas as the heat source. In this case, the hot gas loses heat from the upstream thermoelectric power generation unit 20 in order, thereby decreasing the temperature as moving downstream. Due to this, in the present system of Example 13, the thermoelectric power generation unit 20 placed more downstream has the heat transfer pipe 22 longer than in the case of the thermoelectric power generation unit 20 placed upstream. Due to this, the thermoelectric power generation unit 20 placed downstream is more likely to be heated by the hot gas of the heat source by lengthening the heat transfer pipe 22, making it possible to compensate for the decrease in the heat source gas temperature.

Example 14

In the present system, (the heat transfer pipe 22 of) the thermoelectric power generation unit 20 and (at least a part of) the storage tank 30 are placed to the flow path 50; basically, the temperature of the hot gas (heat source gas temperature) as the heat source is, however, different for each system. Example 14 is characterized by the fact that, depending on the heat source temperature in the position for placing the storage tank 30 to the flow path 50, the ratio of the length of inserting the storage tank 30 into the flow path 50 to the total length of the storage tank 30 (tank insertion length/tank total length) is changed, and then the storage tank 30 is placed to the flow path 50.

Figure 19:
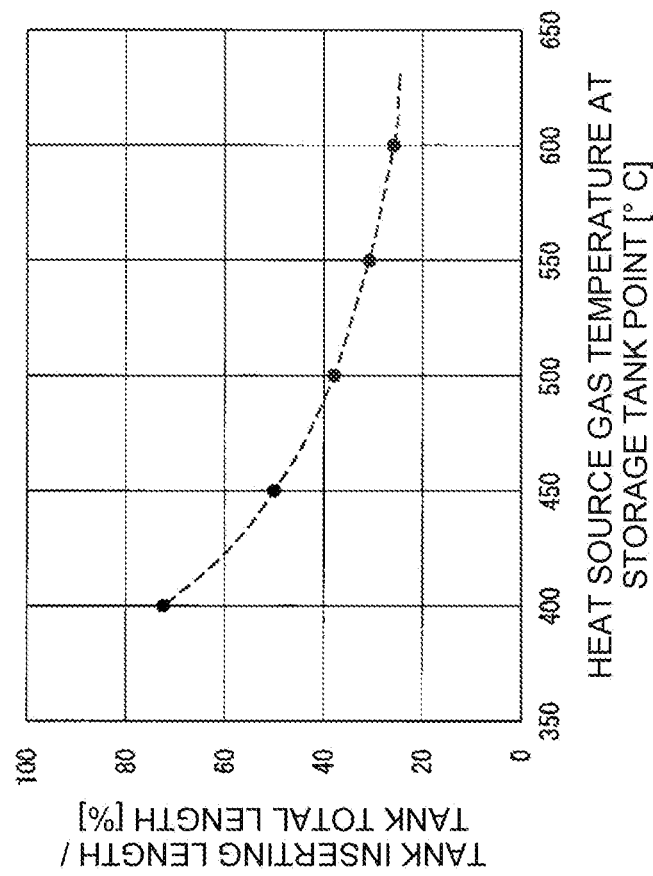
FIG. 19 is a graph showing a relation between the heat source gas temperature and the tank insertion length/tank total length in Example 14 of the thermoelectric power generation system.

FIG. 19 is a graph showing a relation between the heat source gas temperature and the tank insertion length/tank total length. In Example 14, as shown in FIG. 19, the storage tank 30 is placed so that, the higher the heat source gas temperature, the smaller the tank insertion length/tank total length. Such a placing method allows the storage tank 30 with a single specification to serve for acquiring, regardless of the heat source gas temperature, the present system's function of adjusting the heat medium amount.

The embodiments disclosed here are illustrative in all respects and are not intended to be the basis for a limiting interpretation. Therefore, the technical scope of the present invention is not interpreted solely by the embodiments described above, but is defined based on recitations of the claims. It also includes all modifications within the meaning and scope of the claims.

REFERENCE SIGNS LIST

10: thermoelectric power generator
20: thermoelectric power generation unit
21: power generation section
210: thermoelectric element
210A, 210B: thermoelectric module
211: heating section (part of heat exchanger)
212: cooling section
214: unit communicating pipe
22: heat transfer pipe (part of heat exchanger)
30: storage tank
31: heater
32: cooler (cooling section)
321: solenoid valve
322: pressure switch
323: cooling water flow path pipe
324: heat pipe
325: variable control valve
326: pressure sensor
327: controller
40: communicating pipe
40A: branch communicating pipe
40B: branch communicating pipe
41A: check valve
41B: check valve
50: flow path (heating flow path)

The invention claimed is:

1. A thermoelectric power generation system configured to perform a power generation by giving a recovery heat from a heating flow path to a thermoelectric power generator, the thermoelectric power generator comprising:
a heat exchanger configured to:
recover heat from the heating flow path, wherein an interior of an exhaust gas duct through which heated gas flows defines the heating flow path; and
give the recovered heat to a thermoelectric element; and
a storage tank configured to store a heat medium of the heat exchanger, and
wherein:
at least a part of the storage tank is positioned in the heating flow path, and
the heat exchanger is distinct from the storage tank.

2. The thermoelectric power generation system according to claim 1, wherein:
a heat pipe is connected to the storage tank outside of the heating flow path, and
the heat pipe is provided with a cooling section configured to cool the heat medium that flows from the storage tank into the heat pipe.

3. The thermoelectric power generation system according to claim 2, wherein the heat pipe is connected at both ends thereof to the storage tank, forming a loop circuit in a height direction.

4. The thermoelectric power generation system according to claim 2, wherein:
the cooling section has a cooling water flow path pipe configured to circulate cooling water used for cooling the heat medium, and a pressure sensor configured to detect a pressure in the storage tank, and
flowrate of the cooling water flowing in the cooling water flow path pipe is adjustable based on a detection signal of the pressure sensor.

5. The thermoelectric power generation system according to claim 2, wherein:
the heat pipe is provided with a control valve that is configured to control opening and closing or an opening degree, and
movement of the heat medium between the heat pipe and the storage tank is controllable by the control valve.

6. The thermoelectric power generation system according to claim 1, wherein the storage tank is connected to a plurality of heat exchangers that includes the heat exchanger, and circulation paths of the heat medium in the plurality of heat exchangers are in communication with the storage tank by a communicating pipe.

7. The thermoelectric power generation system according to claim 6, wherein:
the plurality of heat exchangers are placed in the heating flow path, transferring of the heat medium from the plurality of heat exchangers to the storage tank is performed in a first heat exchanger of the plurality of heat exchangers with a lowest heat source temperature, and
returning of the heat medium from the storage tank to the plurality of heat exchangers is performed in a second heat exchanger of the plurality of heat exchangers with a highest heat source temperature.

8. The thermoelectric power generation system according to claim 6, wherein:
the plurality of heat exchangers, in a height direction, are placed at different positions in the heating flow path,
transferring of the heat medium from the plurality of heat exchangers to the storage tank is performed in a first heat exchanger of the plurality of heat exchangers with a lowest placing position, and
returning of the heat medium from the storage tank to the plurality of heat exchangers is performed in a second heat exchanger of the plurality of heat exchangers with a highest placing position.

9. The thermoelectric power generation system according to claim 1, wherein:
the heat exchanger is placed in the heating flow path, and has a heat transfer pipe group configured to heat the heat medium by a heat of a heat source flowing in the heating flow path, and
the storage tank is placed in a gap section in the heat transfer pipe group.

10. The thermoelectric power generation system according to claim 1, wherein the storage tank is placed at a position in the heating flow path, where a heat source temperature is lower than in the heat exchanger.

11. The thermoelectric power generation system according to claim 7, comprising:
a controller configured to switch, based on a timer operation in a predetermined cycle, the transferring of the heat medium from the plurality of heat exchangers to the storage tank and the returning of the heat medium from the storage tank to the plurality of heat exchangers.

12. The thermoelectric power generation system according to claim 7, comprising:
a controller configured to switch the transferring of the heat medium from the plurality of heat exchangers to the storage tank and the returning of the heat medium from the storage tank to the plurality of heat exchangers, based on a heat medium temperature of one heat exchanger, among the plurality of the heat exchangers, where an amount of the heat medium in the one heat exchanger is less than an amount of the heat medium in other heat exchangers of the plurality of heat exchangers.

13. The thermoelectric power generation system according to claim 1, wherein the storage tank is in fluid communication with the heat exchanger via a pipe.

14. The thermoelectric power generation system according to claim 1, further comprising a flow path that enables the heat medium to flow (i) from the storage tank to the heat exchanger and (ii) from the heat exchanger to the storage tank.

15. The thermoelectric power generation system according to claim 1, wherein the at least the part of the storage tank that is placed in the heating flow path is exposed to a heat source external to the storage tank.

16. The thermoelectric power generation system according to claim 1, wherein the heat exchanger includes a heating section and a heat pipe, and wherein an internal space of the heating section is in fluid communication with an internal space of the heat pipe.

17. A thermoelectric power generation system comprising:
   a heat exchanger configured to:
      recover heat from a heating flow path, wherein an interior of a structure defines the heating flow path; and
      provide the recovered heat to a thermoelectric element; and
   a storage tank configured to store a heat medium, wherein:
      the storage tank is in fluid communication with the heat exchanger,
      a portion of the storage tank is positioned within the interior of the structure defining the heating flow path, and
      the heat exchanger is distinct from the storage tank.

18. The thermoelectric power generation system according to claim 17, wherein a second portion of the storage tank is positioned exterior to the structure.

19. The thermoelectric power generation system according to claim 18, wherein a heat pipe is connected to the second portion of the storage tank.

20. The thermoelectric power generation system according to claim 19, wherein the heat pipe includes a cooling section configured to cool heat medium in the heat pipe, and wherein the cooling section has a cooling water flow path pipe configured to circulate cooling water used for cooling the heat medium.

* * * * *